(12) United States Patent
Chae et al.

(10) Patent No.: US 12,451,871 B2
(45) Date of Patent: Oct. 21, 2025

(54) SEMICONDUCTOR DEVICE

(71) Applicant: SAMSUNG ELECTRONICS CO., LTD., Suwon-si (KR)

(72) Inventors: Kwanyeob Chae, Suwon-si (KR); Chulwoo Kim, Seoul (KR); Yoonjae Choi, Seoul (KR); Kyeongkeun Kang, Suwon-si (KR)

(73) Assignees: SAMSUNG ELECTRONICS CO., LTD., Suwon-si (KR); Korea University Research and Business Foundation, Seoul (KR)

( * ) Notice: Subject to any disclaimer, the term of this patent is extended or adjusted under 35 U.S.C. 154(b) by 184 days.

(21) Appl. No.: 18/087,439

(22) Filed: Dec. 22, 2022

(65) Prior Publication Data
US 2023/0344417 A1    Oct. 26, 2023

(30) Foreign Application Priority Data
Apr. 20, 2022   (KR) .................. 10-2022-0048717

(51) Int. Cl.
*H03K 3/012* (2006.01)
*H03K 17/687* (2006.01)

(52) U.S. Cl.
CPC ......... *H03K 3/012* (2013.01); *H03K 17/6872* (2013.01)

(58) Field of Classification Search
CPC ............... H03K 3/012; H03K 17/6872; H03K 19/018507; H03K 19/01721; H03K 7/08
See application file for complete search history.

(56) References Cited

U.S. PATENT DOCUMENTS 10,128,842 B1   11/2018   Lin
10,841,138 B2   11/2020   Farzan et al.
(Continued)

FOREIGN PATENT DOCUMENTS

KR     102257212 B1    5/2021

OTHER PUBLICATIONS

Jeong, et al., "A 0.64-pJ/Bit 28-GB/s/Pin High-Linearity Single-Ended PAM-4 Transmitter With an Impedance-Matched Driver and Three-Point ZQ Calibration for Memory Interface", IEEE Journal of Solid-State Circuits, vol. 56, No. 4, Apr. 2021, pp. 1278-1287, 10 pages.
(Continued)

*Primary Examiner* — Sibin Chen
(74) *Attorney, Agent, or Firm* — Sughrue Mion, PLLC

(57) ABSTRACT

A semiconductor device is provided. The semiconductor device includes: an equalizer circuit configured to output a first control signal corresponding to a first bit of original two-bit data and a second control signal corresponding to a second bit of the original two-bit data; and a driver circuit including a plurality of pull-up transistors connected between an output node and a first power node configured to provide a first power supply voltage, and a plurality of pull-down transistors connected between the output node and a second power node configured to provide a second power supply voltage, wherein the second power supply voltage is lower than the first power supply voltage, and the driver circuit is connected to the equalizer circuit in series. The plurality of pull-up transistors includes a first pull-up transistor and a second pull-up transistor connected to each other in parallel, between the first power node and the output node, and a third pull-up transistor and a fourth pull-up transistor connected to each other in series, between the first power node and the output node.

16 Claims, 12 Drawing Sheets

(56) References Cited

U.S. PATENT DOCUMENTS

| | | |
|---|---|---|
| 10,880,133 B2 | 12/2020 | Chong |
| 2009/0237109 A1* | 9/2009 | Haig .................. H04L 25/0278 |
| | | 326/30 |
| 2011/0001588 A1 | 1/2011 | Yuki et al. |
| 2016/0285451 A1 | 9/2016 | McCall et al. |
| 2017/0222845 A1 | 8/2017 | Zerbe et al. |
| 2019/0109585 A1* | 4/2019 | Tang .................. H03K 17/6871 |
| 2019/0379357 A1 | 12/2019 | Kang et al. |
| 2020/0382121 A1* | 12/2020 | Jeong ................. H03K 19/0005 |
| 2021/0175875 A1 | 6/2021 | Li et al. |
| 2021/0306016 A1 | 9/2021 | Toi |
| 2021/0367598 A1 | 11/2021 | Hyun et al. |
| 2022/0231678 A1* | 7/2022 | Wu .................. H03K 19/00361 |
| 2023/0027926 A1* | 1/2023 | Kang ..................... G11C 11/56 |
| 2023/0113660 A1* | 4/2023 | Jeong .............. H03K 19/17784 |
| | | 326/41 |

OTHER PUBLICATIONS

Ramachandran, et al., "Line Coding Techniques for Channel Equalization: Integrated Pulse-Width Modulation and Consecutive Digit Chopping", IEEE Transactions on Circuits and Systems-I: Regular Papers, vol. 66, No. 3, Mar. 2019, pp. 1192-1204, 13 pages.
Office Action dated Aug. 21, 2025, issued by Korean Patent Office in Korean Patent Application No. 10-2022-0048717.

* cited by examiner

SEMICONDUCTOR DEVICE

CROSS-REFERENCE TO RELATED APPLICATION

This application claims the benefit under 35 USC 119(a) of Korean Patent Application No. 10-2022-0048717 filed on Apr. 20, 2022 in the Korean Intellectual Property Office, the entire disclosure of which is incorporated herein by reference for all purposes.

BACKGROUND

The present disclosure relates to a semiconductor device.

Semiconductor devices may operate by exchanging signals with other external semiconductor devices, and the data may be indicative of data. To improve the speed at which the semiconductor device exchanges data with other external semiconductor devices, the semiconductor devices may send and receive data using a multilevel signal having three or more levels, unlike a non-return zero (NRZ) signal. The multilevel signal has a relatively small eye margin compared to the NRZ signal, and thus various methods have been proposed to improve the eye margin of the multilevel signal to sufficiently secure signal integrity.

SUMMARY

One or more example embodiments provide a semiconductor device in which an eye margin of a multilevel signal may be improved and signal integrity may be effectively secured, by improving Ratio Level Mismatch (RLM) of the multilevel signal using a driver outputting a multilevel signal and an equalizer connected to the driver.

According to example embodiments, a semiconductor device includes: an equalizer circuit configured to output a first control signal corresponding to a first bit of original two-bit data and a second control signal corresponding to a second bit of the original two-bit data; and a driver circuit including a plurality of pull-up transistors connected between an output node and a first power node configured to provide a first power supply voltage, and a plurality of pull-down transistors connected between the output node and a second power node configured to provide a second power supply voltage, wherein the second power supply voltage is lower than the first power supply voltage, and the driver circuit is connected to the equalizer circuit in series. The plurality of pull-up transistors and the plurality of pull-down transistors are configured to respectively turn on and off according to the first control signal or the second control signal. The plurality of pull-up transistors includes a first pull-up transistor and a second pull-up transistor connected to each other in parallel, between the first power node and the output node, and a third pull-up transistor and a fourth pull-up transistor connected to each other in series, between the first power node and the output node. The plurality of pull-down transistors includes a first pull-down transistor and a second pull-down transistor connected to each other in parallel, between the second power node and the output node.

According to example embodiments, a semiconductor device includes: a first pull-up transistor and a second pull-up transistor connected to each other in parallel, between an output node and a first power node configured to supply a first power supply voltage; a first pull-down transistor and a second pull-down transistor connected in parallel, between the output node and a second power node configured to supply a second power supply voltage lower than the first power supply voltage; and a pull-up compensation circuit connected between the first power node and the output node. The pull-up compensation circuit includes a third pull-up transistor and a fourth pull-up transistor connected to each other in series, between the first power node and the output node.

According to example embodiments, a semiconductor device includes: a serializer circuit configured to output serialized data having N-bits; an equalizer circuit configured to output N control signals, at least one of which has a pulse width that has been adjusted with reference to each of the N-bits; and a driver circuit including a plurality of pull-up transistors and a plurality of pull-down transistors configured to turn on and off according to the N control signals, wherein each of the plurality of pull-up transistors and each of the plurality of pull-down transistors is an NMOS transistor. A number of the plurality of pull-up transistors is greater than a number of the plurality of pull-down transistors, and at least two of the plurality of pull-up transistors are connected to each other in series.

BRIEF DESCRIPTION OF DRAWINGS

The above and other aspects and features will be more clearly understood from the following description, taken in conjunction with the accompanying drawings, in which.

DETAILED DESCRIPTION

Hereinafter, example embodiments will be described with reference to the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
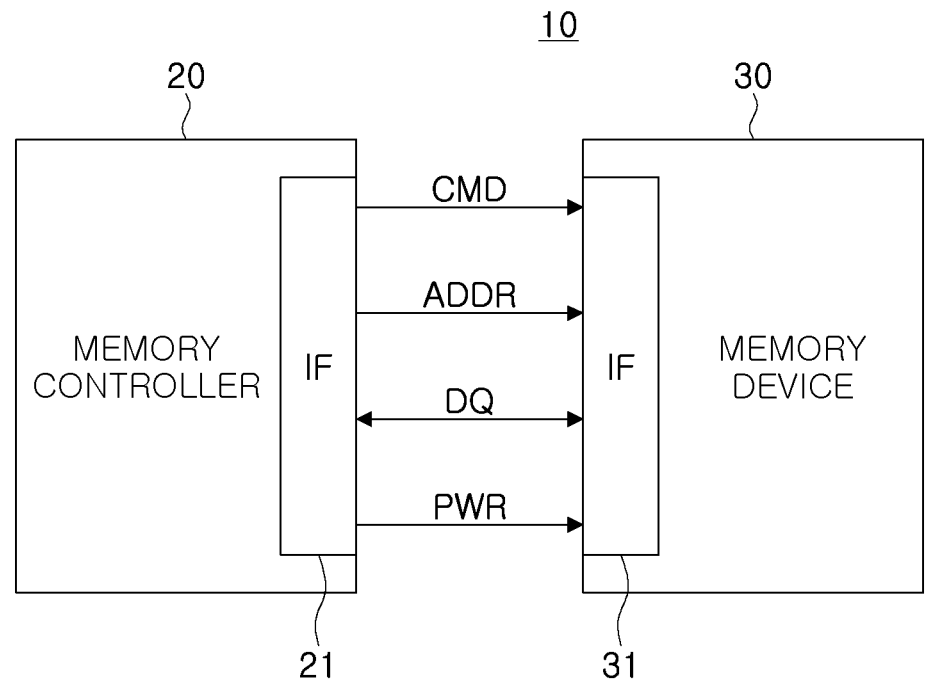
FIG. 1 is a diagram schematically illustrating a system including semiconductor devices according to an example embodiment.

FIG. 1 is a diagram schematically illustrating a system including semiconductor devices according to an example embodiment.

Referring to FIG. 1, a system 1 according to an example embodiment includes a plurality of semiconductor devices. For example, the plurality of semiconductor devices may include a memory controller 20 and a memory device 30. The memory controller 20 and the memory device 30 may respectively include interfaces 21 and 31. The interface 21 of the memory controller 20 may output a command signal CMD, an address signal ADDR, a power supply voltage PWR, and the like to the interface 31 of the memory device 30. The memory device 30 may operate by receiving the power supply voltage PWR, and may execute a program operation for writing data based on the command signal CMD and the address signal ADDR, and a read operation for reading the stored data or the like.

The memory controller 20 and the memory device 30 may exchange data signals DQ with each other through the interfaces 21 and 31. The data signal DQ may indicate at least one of data to be stored in the memory device 30 and data stored in the memory device 30.

There is a need to improve the data rate in order to improve the performance of the system 10, the operating speed of the memory controller 20 and the memory device 30, as well as the speed at which the memory controller 20 and the memory device 30 exchange data signals DQ. For example, in order to increase the data rate, the data signal DQ may be configured as a multilevel signal transitioning between three or more different levels instead of the NRZ signal which transitions between two different levels. For example, when the data signal DQ is configured as a multilevel signal that transitions between four different levels, 2-bit data may be transferred to the memory controller 20 by the data signal DQ during one unit period.

In an example embodiment, when the data signal DQ is changed from the NRZ signal to a multilevel signal having four different levels, the data rate may be doubled using a clock signal having the same speed. However, as the data signal DQ is changed from the NRZ signal to the multilevel signal, the eye margin of the data signal DQ is reduced and thus signal integrity may be deteriorated.

One or more example embodiments provide a semiconductor device that includes a driver, an equalizer, and the like capable of solving the above problems. A semiconductor device according to an example embodiment may include at least one of a driver capable of minimizing reduction in an eye margin, and an equalizer connected in series with the driver to adjust a control signal input to the driver in a pulse width modulation method. Accordingly, the performance of the system 10 may be improved by minimizing the reduction in the eye margin of the multilevel signal and maximizing the signal integrity.

Figure 2:
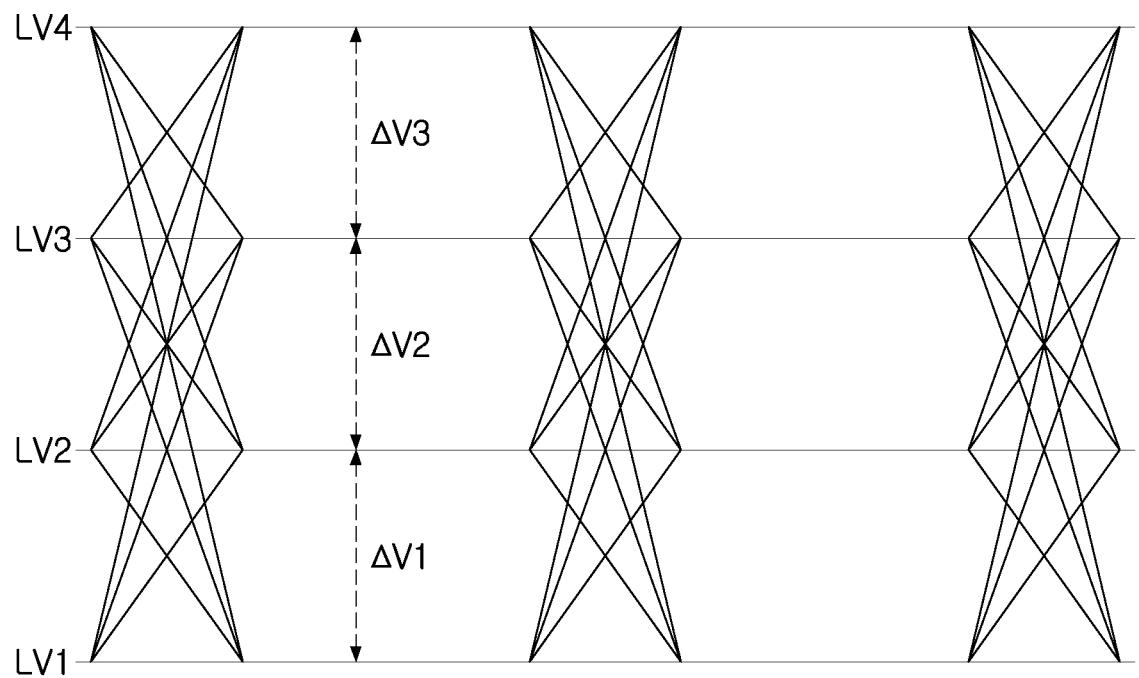
FIGS. 2 and 3 are diagrams illustrating a multilevel signal transmitted and received by a semiconductor device according to an example embodiment.
Figure 3:
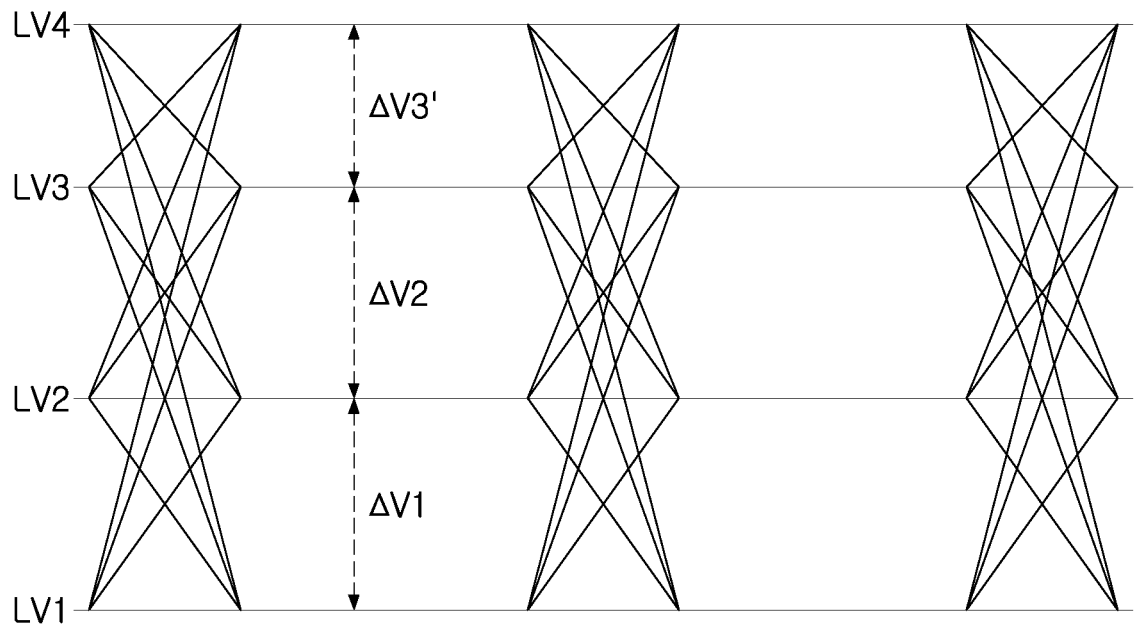

FIGS. 2 and 3 are diagrams illustrating a multilevel signal transmitted and received by a semiconductor device according to an example embodiment.

Referring to FIGS. 2 and 3, in an example embodiment, a multilevel signal transmitted and received by a semiconductor device may have four levels: a first level LV1, a second level LV2, a third level LV3 and a fourth level LV4. The semiconductor device may transmit and receive a multilevel signal generated based on 4-level pulse amplitude modulation (PAM-4). When data is transmitted as a multilevel signal generated based on 4-level pulse width modulation, 2-bit data may be transmitted for one unit time.

For example, the four levels LV1-LV4 may respectively correspond to data of 00, 01, 10, and 11. Accordingly, the memory device may receive two bits, for example, one of 00, 10, 01, and 11 during one unit time. When a semiconductor device transmits/receives a multilevel signal, it may include a driver for generating a multilevel signal corresponding to 2-bit data, a multilevel receiver for receiving the multilevel signal to restore 2-bit data, and the like. For example, the first level LV1 corresponds to data 00, the second level LV2 corresponds to data 01, the third level LV3 corresponds to data 10, and the fourth level LV4 corresponds to data 11.

FIG. 2 is a diagram illustrating a multilevel signal in an ideal case. Accordingly, in the multilevel signal, the first voltage difference $\Delta V1$ that is the difference between the first level LV1 and the second level LV2 and the second voltage that is the difference between the second level LV2 and the third level LV3 The difference $\Delta V2$ and the third voltage difference $\Delta V3$ that is the difference between the third level LV3 and the fourth level LV4 may be equal to each other.

On the other hand, in the multilevel signal actually transmitted by the semiconductor device, at least some of the first voltage difference $\Delta V1$, the second voltage difference $\Delta V2$, and the third voltage difference $\Delta V3$ may be different from each other. Referring to FIG. 3, the third voltage difference $\Delta V3'$ may be smaller than the first voltage difference $\Delta V1$ and the second voltage difference $\Delta V2$. Accordingly, as illustrated in FIG. 3, and in contrast to FIG. 2, a Ratio of Level Mismatch (RLM), which is one of characteristics of a multilevel signal, may deteriorate and an eye margin may decrease.

According to example embodiments, the driver for outputting a multilevel signal may further include a larger number of pull-up elements than the pull-down elements. Also, at least some of the pull-up elements included in the driver may be connected in series, between the output node and the power node. Hereinafter, it will be described in more detail with reference to FIGS. 4 and 5.

Figure 4:
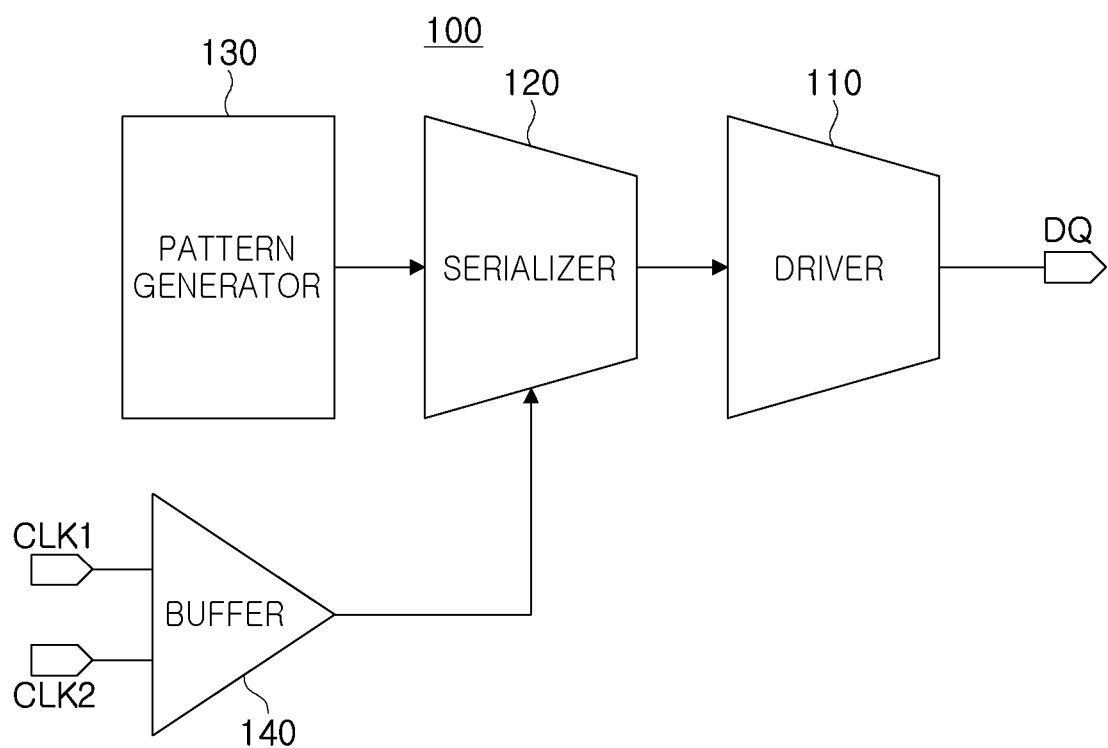
FIG. 4 is a schematic block diagram of a semiconductor device according to an example embodiment.

FIG. 4 is a schematic block diagram of a semiconductor device according to an example embodiment.

Referring to FIG. 4, the semiconductor device 100 according to an example embodiment may include a driver 110, a serializer 120, a pattern generator 130, and a buffer 140. The driver 110 may output a data signal DQ, and the data signal DQ may be a multilevel signal that transitions between three or more levels.

The serializer 120 may receive the data pattern output by the pattern generator 130, and may serialize and output the bits included in the data pattern in parallel based on the clock signal transmitted by the buffer 140. The buffer 140 may receive the first clock signal CLK1 and the second clock signal CLK2, and provide the signals to the serializer 120. For example, the first clock signal CLK1 and the second clock signal CLK2 may have a phase difference of 180 degrees from each other.

The serializer 120 may serialize the data received from the pattern generator 130 to output N-bit data during one unit period. The driver 110 may operate by receiving N bits included in N-bit data as control signals. For example, the serializer 120 may serialize 32-bit data received from the pattern generator 130 to output 2-bit data.

The driver 110 may include a plurality of pull-up elements and a plurality of pull-down elements. Each of the plurality of pull-up elements and the plurality of pull-down elements may be turned on and turned off by the first control signal corresponding to the upper bit of the 2-bit data output by the serializer 120 or the second control signal corresponding to the lower bit of the 2-bit data output by the serializer 120. Hereinafter, the structure of the driver 110 will be described in more detail with reference to FIG. 5.

Figure 5:
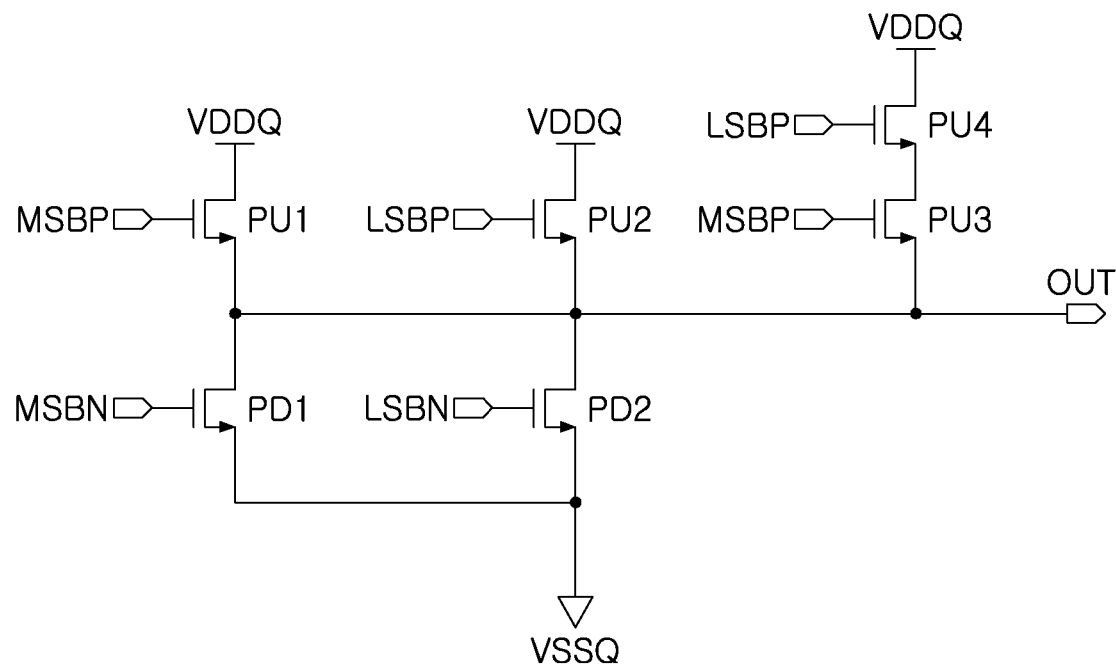
FIG. 5 is a schematic circuit diagram illustrating a driver included in a semiconductor device according to an example embodiment.

FIG. 5 is a schematic circuit diagram illustrating a driver included in a semiconductor device according to an example embodiment. FIGS. 6 to 9 are diagrams provided to explain an operation of a driver included in a semiconductor device according to an example embodiment.

Referring to FIG. 5, a driver included in a semiconductor device according to an example embodiment may output a multilevel signal capable of transmitting 2-bit data for one unit time. The driver includes a plurality of pull-up elements PU1-PU4 and a plurality of pull-down elements PD1-PD2, and the number of the plurality of pull-up elements PU1-PU4 may be greater than the number of the plurality of pull-down elements PD1-PD2. For example, the number of the plurality of pull-up elements PU1-PU4 may be more than twice that of the plurality of pull-down elements PD1-PD2.

The plurality of pull-up elements PU1-PU4 are connected between a first power node supplying the first power supply voltage VDDQ and an output node through which the output signal OUT may be output. The plurality of pull-down elements PD1-PD2 may be connected between the second power node supplying the second power supply voltage VSSQ and the output node. The second power supply voltage VSSQ is less than the first power supply voltage VDDQ, and when the driver is included in a memory device, the first power supply voltage VDDQ and the second power supply voltage VSSQ may be applied to an external host or power management. The device may be an input/output power supply voltage supplied to the interface of the memory device.

The first pull-up element PU1 and the second pull-up element PU2 are connected to each other in parallel, between the first power node and the output node, and the first pull-down element PD1 and the second pull-down element PD2 may be connected in parallel between the second power node and the output node. On the other hand, the third pull-up element PU3 and the fourth pull-up element PU4 are connected to each other in series, and thus the fourth pull-up element PU4 is connected to the third pull-up element PU3 and the second pull-up element PU3 may be connected between power nodes. The third pull-up element PU3 and the fourth pull-up element PU4 may provide a pull-up compensation circuit.

The driver according to an example embodiment, as illustrated in FIG. 5, may be a Low Voltage Swing Terminated Logic (LVSTL) driver, and includes a plurality of pull-up elements PU1-PU4 and a plurality of pull-down elements PD1-PD2. Each of the pull-up elements and the pull-down elements may be implemented with an NMOS transistor. The first pull-up element PU1 may be turned on and off by the first control signal MSBP, and the second pull-up element PU2 may be turned on by the second control signal LSBP, and turned-off. The third pull-up element PU3 may be turned on and off by the first control signal MSBP, and the fourth pull-up element PU4 may be turned on by the second control signal LSBP.

Each of the plurality of pull-down elements PD1-PD2 may be turned on and turned off by a complementary signal of the first control signal MSBP or a complementary signal of the second control signal LSBP. For example, the first pull-down element PD1 may be turned on and off by the first complementary control signal MSBN, which is a complementary signal of the first control signal MSBP, and the second pull-down element PD2 may be turned on and turned off by the second complementary control signal LSBN, which is a complementary signal of the second control signal LSBP.

The first control signal MSBP may have a logic level determined by the upper bit of the 2-bit data input to the driver. For example, when the high-order bit is [1], the first control signal MSBP may have a high logic level, and when the high-order bit is [0], the first control signal MSBP may have a low logic level. The second control signal LSBP may have a logic level determined by a lower bit of 2-bit data input to the driver. For example, when the lower bit is [1], the second control signal LSBP may have a high logic level, and when the lower bit is [0], the second control signal LSBP may have a low logic level.

Hereinafter, the operation of the driver according to 2-bit data input to the driver will be described in more detail with reference to FIGS. 6 to 9.

Figure 6:
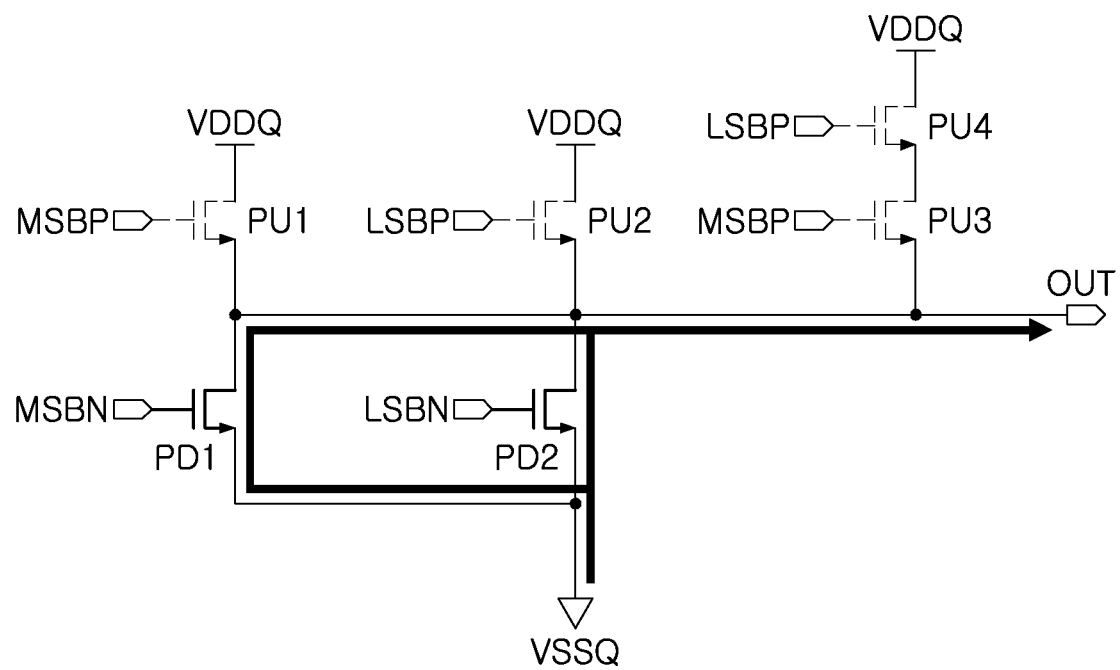
FIGS. 6 to 9 are diagrams provided to explain an operation of a driver included in a semiconductor device according to an example embodiment.

First, FIG. 6 is a diagram provided to explain the operation of the driver when 2-bit data input to the driver is [00]. When the driver input data is [00], both the first control signal MSBP and the second control signal LSBP may have a low logic level. Accordingly, as illustrated in FIG. 6, all of the plurality of pull-up elements PU1-PU4 may be turned off.

On the other hand, both the first complementary control signal MSBN and the second complementary control signal LSBN input to the plurality of pull-down elements PD1-PD2 may have a high logic level. Accordingly, all of the plurality of pull-down elements PD1-PD2 are turned on, and an output node may be connected to the second power node to output an output signal having the lowest voltage level.

Figure 7:
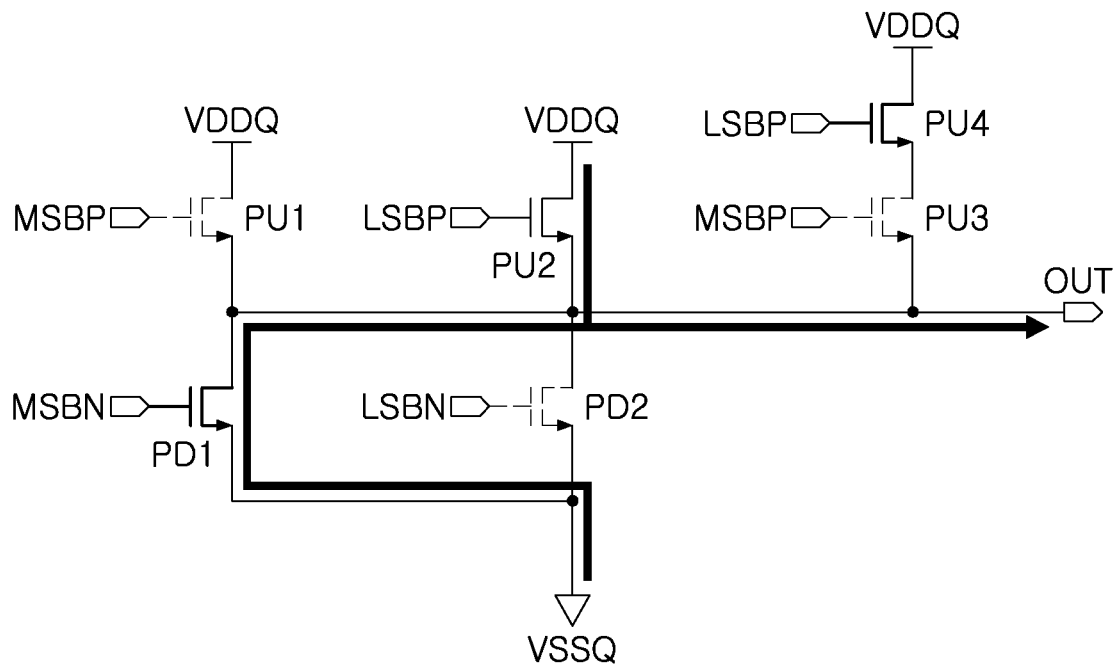

Next, FIG. 7 is a diagram illustrating the operation of the driver when 2-bit data input to the driver is [01]. When data [01] is input to the driver, the first control signal MSBP may have a low logic level and the second control signal LSBP may have a high logic level. Accordingly, the first pull-up element PU1 and the third pull-up element PU3 among the plurality of pull-up elements PU1-PU4 are turned off, and the second pull-up element PU2 and the fourth pull-up element PU4 may be turned on. Among the plurality of pull-down elements PD1-PD2, the first pull-down element PD1 may be turned on, and the second pull-down element PD2 may be turned off.

Accordingly, as illustrated in FIG. 7, a path connecting the first power node and the second power node may be formed by the second pull-up element PU2 and the first pull-down element PD1, the voltage level of the output signal OUT may be determined by the turn-on resistance of the second pull-up element PU2 and the turn-on resistance of the first pull-down element PD1. For example, the turn-on resistance of the second pull-up element PU2 may be greater than the turn-on resistance of the first pull-down element PD1.

Figure 8:
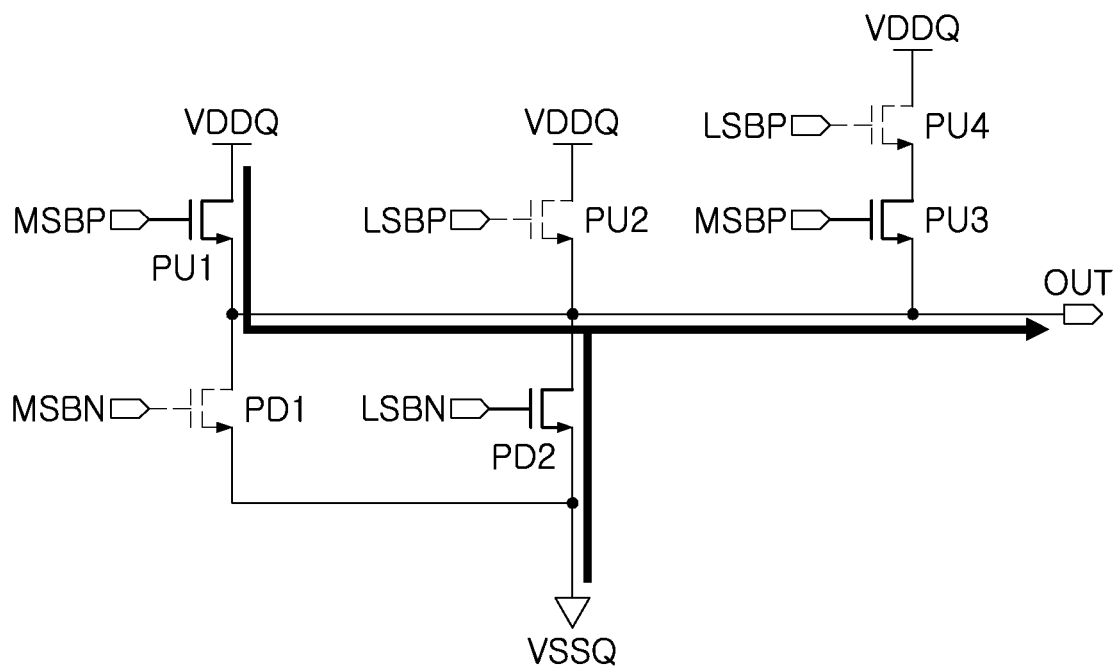

FIG. 8 is a diagram illustrating the operation of the driver when 2-bit data input to the driver is [10]. When data [10] is input to the driver, the first control signal MSBP may have a high logic level and the second control signal LSBP may have a low logic level. Accordingly, the first pull-up element PU1 and the third pull-up element PU3 among the plurality of pull-up elements PU1-PU4 are turned on, and the second pull-up element PU2 and the fourth pull-up element PU4 may be turned off. The first pull-down element PD1 may be turned off, and the second pull-down element PD2 may be turned on.

Accordingly, as illustrated in FIG. 8, a path connecting the first power node and the second power node may be formed by the first pull-up element PU1 and the second pull-down element PD2, and the voltage level of the output signal OUT may be determined by the turn-on resistance of the first pull-up element PU1 and the turn-on resistance of the second pull-down element PD2. In The turn-on resistance of the first pull-up element PU1 may be smaller than the turn-on resistance of the second pull-down element PD2, according to an example embodiment. Accordingly, the voltage level of the output signal OUT output by the driver when data [10] is input may be greater than the voltage level of the output signal OUT when data [01] is input.

Figure 9:
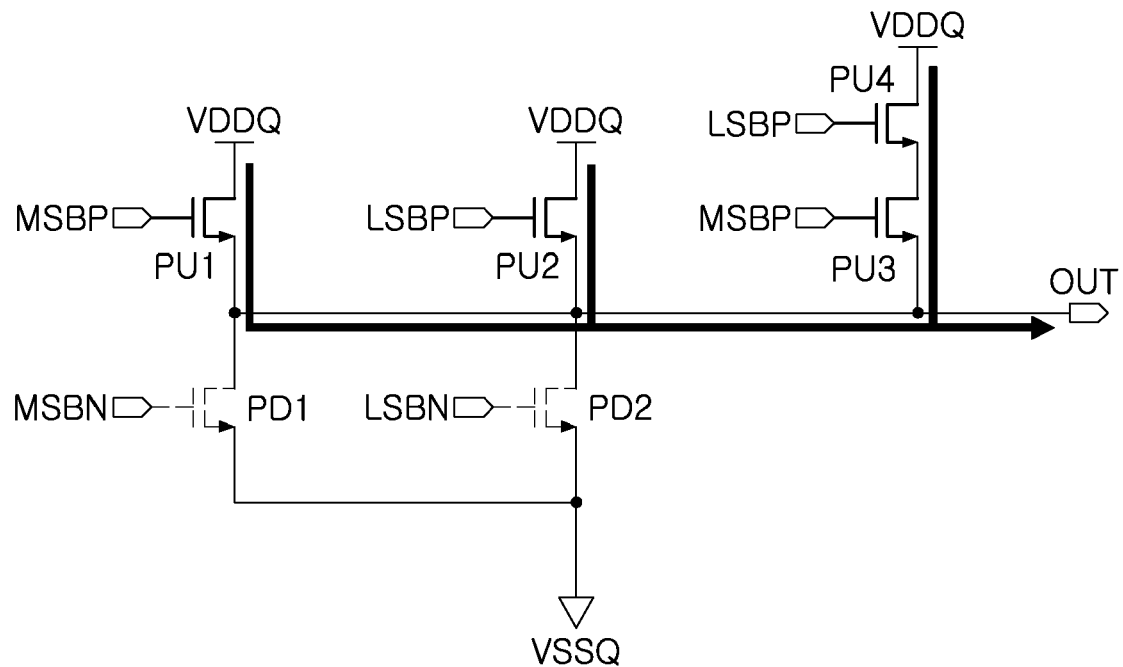

FIG. 9 is a diagram illustrating the operation of the driver when 2-bit data input to the driver is [11]. When data [11] is input to the driver, both the first control signal MSBP and the second control signal LSBP may have a high logic level. Accordingly, all of the plurality of pull-up elements PU1-PU4 may be turned on, and all of the plurality of pull-down elements PD1-PD2 may be turned off.

Referring to FIG. 9, the output node may be connected to the first power node through the plurality of pull-up elements PU1-PU4 to receive the first power supply voltage VDDQ. A path capable of increasing the voltage level of the output signal by charging the output node by the first power supply voltage VDDQ includes a third pull-up element in addition to the first pull-up element PU1 and the second pull-up element PU4. Because they are added by the third pull-up element PU3 and the fourth pull-up element PU4, when the data to be transmitted through the output signal is [11], the voltage level of the output signal may be sufficiently increased.

Also, as described with reference to FIGS. 5 to 9, the third pull-up element PU3 and the fourth pull-up element PU4 are connected in series, between the output node and the first power node. By doing so, it is possible to implement a driver that may improve RLM without a separate encoder. For example, when only one pull-up element is additionally connected between the first power node and the output node in addition to the first pull-up element PU1 and the second pull-up element PU2, a separate the control signal processed using the encoder may have to be input to the driver.

On the other hand, in an example embodiment, the third pull-up element PU3 and the fourth pull-up element PU4 that are additionally connected are connected in series, between the output node and the first power node. As described with reference to FIGS. 7 and 8, when data is [01] or [10], one of the third pull-up element PU3 and the fourth pull-up element PU4 may be turned off, and the third pull-up element PU3 and the fourth pull-up element PU4 may not affect the output signal OUT. Therefore, without a separate encoder, the driver may be controlled by using the high-order bit and the low-order bit of the 2-bit data as it is as a control signal.

Figure 10:
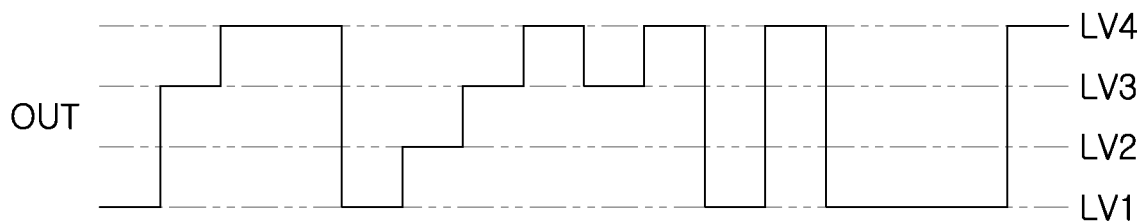
FIG. 10 is a diagram provided to explain an operation of a driver included in a semiconductor device according to an example embodiment.

FIG. 10 is a diagram provided to explain an operation of a driver included in a semiconductor device according to an example embodiment.

Hereinafter, it will be described with reference to the driver illustrated in FIG. 5. Referring to FIGS. 5 and 10 together, the driver according to an example embodiment uses a high-order bit (Most Significant Bit, MSB) and a low-order bit (LSB) included in 2-bit data as a control signal. The high-order bit MSB and the low-order bit LSB may be input as control signals to the plurality of pull-up elements PU1-PU4 included in the driver. The complementary value of the upper bit MSB and the complementary value of the lower bit LSB may be input to the plurality of pull-down elements PD1-PD2 as control signals.

Referring to FIG. 10, data [00] is input in the first unit section, and therefore only the pull-down elements PD1-PD2 included in the driver may be turned on. The output signal OUT may be set to the lowest first level LV1. In the second unit section, data [10] is input, and only the first pull-up element PU1 and the second pull-down element PD2 may be turned on in the driver. During the second unit period, the output signal OUT may be set to the third level LV3.

In the third unit section and the fourth unit section, data [11] is input, and only the plurality of pull-up elements PU1-PU4 are turned on in the driver so that the output signal OUT is set to the fourth level LV4. At this time, in addition to the first pull-up element PU1 and the second pull-up element PU2, the third pull-up element PU3 and the fourth pull-up element PU4 are both turned on and output, and the level of the signal OUT may be sufficiently raised to the fourth level LV4. Accordingly, the eye margin between the third level LV3 and the fourth level LV4 may be increased, and the RLM of the output signal OUT may be improved.

Figure 11:
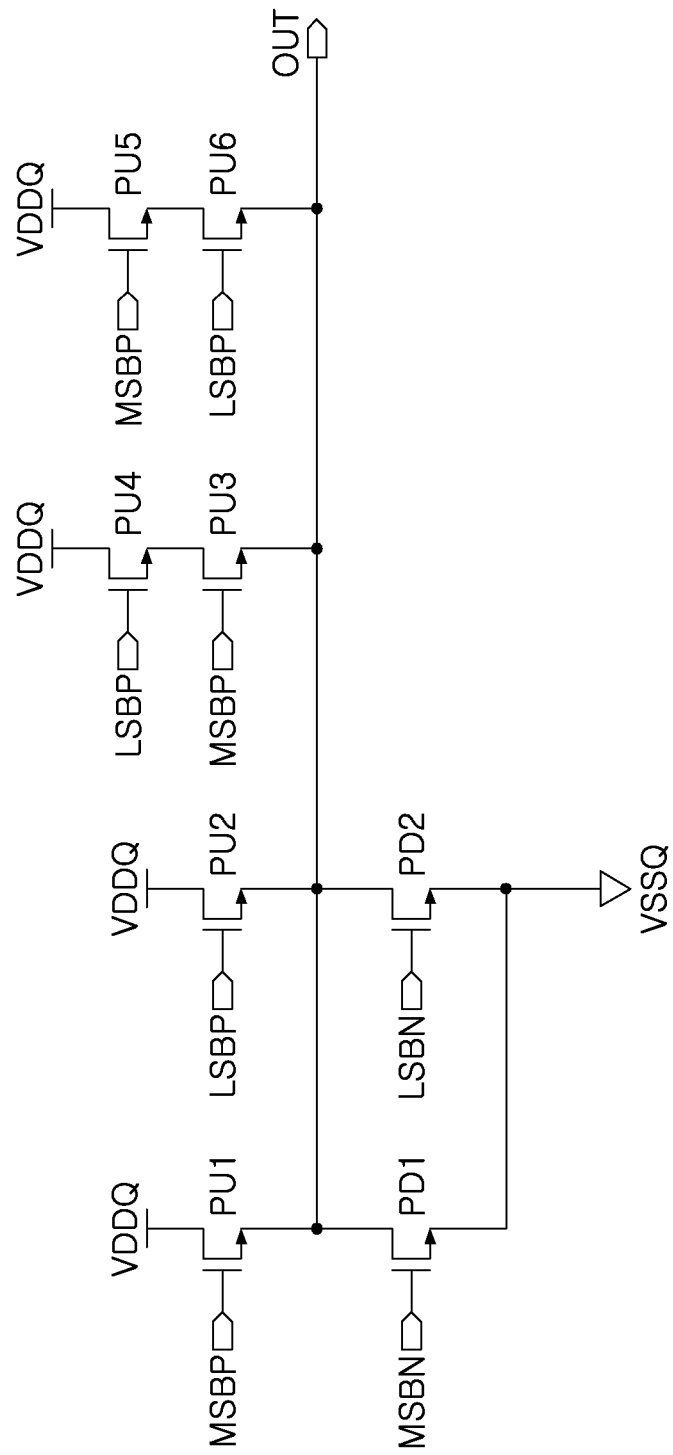
FIG. 11 is a schematic circuit diagram illustrating a driver included in a semiconductor device according to an example embodiment.

FIG. 11 is a schematic circuit diagram illustrating a driver included in a semiconductor device according to an example embodiment.

Referring to FIG. 11, a driver included in a semiconductor device according to an example embodiment may output a multilevel signal capable of transmitting 2-bit data for one unit time. The driver includes a plurality of pull-up elements PU1-PU6 and a plurality of pull-down elements PD1-PD2, and the number of the plurality of pull-up elements PU1-PU6 may be greater than the number of the plurality of pull-down elements PD1-PD2.

In contrast to FIG. 5, as illustrated in FIG. 11, the driver may further include a fifth pull-up element PU5 and a sixth pull-up element PU6. The fifth pull-up element PU5 may be connected between the sixth pull-up element PU6 and the first power node. The third pull-up element PU3, the fourth pull-up element PU4, the fifth pull-up element PU5, and the sixth pull-up element PU6 may provide a pull-up compensation circuit.

Accordingly, when data [01] is transmitted, the third pull-up element PU3 and the fifth pull-up element PU5 are turned off, and the fourth pull-up element PU4 and the sixth pull-up element PU6 are turned on. On the other hand, when data [10] is transmitted, the third pull-up element PU3 and the fifth pull-up element PU5 are turned on, and the fourth pull-up element PU4 and the sixth pull-up element PU6 are turned off By configuring the driver as illustrated in FIG. 11, the influence of previous data may be minimized and the eye margin may be more efficiently secured.

Figure 12:
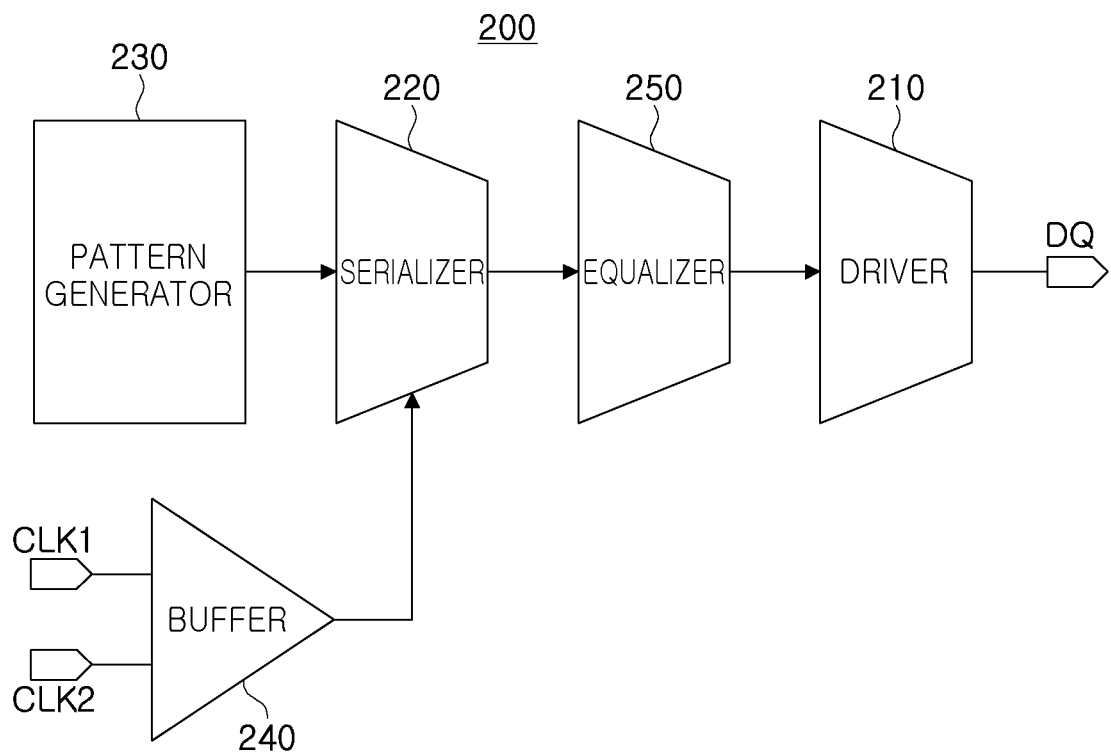
FIG. 12 is a schematic block diagram of a semiconductor device according to an example embodiment.

FIG. 12 is a schematic block diagram of a semiconductor device according to an example embodiment.

Referring to FIG. 12, the semiconductor device 200 according to an example embodiment includes a driver 210, a serializer 220 (e.g., a serializer circuit), a pattern generator 230 (e.g., a pattern generator circuit), a buffer 240, and an equalizer 250. The configuration and operation of the driver 210 may correspond to the drivers discussed above with reference to FIGS. 5 to 11. The driver 210 may output a data signal DQ, and the data signal DQ may be a multilevel signal that transitions between three or more levels.

Operations of the serializer 220, the pattern generator 230, and the buffer 240 may be similar to those described above with reference to FIG. 4. For example, the serializer 220 may serialize a data pattern output by the pattern generator 230 based on a clock signal output by the buffer 240.

The serializer 220 may output N-bit data during one unit period, and the equalizer 250 connected between the serializer 220 and the driver 210 includes N control signals corresponding to N-bit data may be output to the driver 210. When the data output from the serializer 220 includes 2-bit data per unit section, the equalizer 250 provides a first control signal corresponding to a high-order bit of the data and a second control signal corresponding to a low-order bit of the data. A control signal may be output. Therefore, as illustrated in FIG. 12, each of the upper bit and the lower bit of the data to be transmitted may not be directly input to the plurality of pull-up elements and the plurality of pull-down elements included in the driver 210, as a control signal.

In an example embodiment, the equalizer 250 receives each of the upper bit and the lower bit included in the data output from the serializer 220, the higher bit and the lower bit of the data from the serializer 220. A first control signal and a second control signal may be generated by comparing the lower bit with a previous lower bit and comparing the upper bit with a previous upper bit. For example, the equalizer 250 determines whether a high-order bit of data output by the serializer 220 in the current unit section is the same as a high-order bit of data output by the serializer 220 in a previous unit section, a rising edge and a falling edge of the first control signal may be adjusted. Accordingly, the first control signal output from the equalizer 250 may have a pulse width different from that of the upper bit of the data output from the serializer 220.

The equalizer 250 adjusts the pulse widths of the first control signal and the second control signal by comparing the upper bit and the lower bit of the data output from the serializer 220 with the upper bit and the lower bit of the previous time, respectively. As an example, the equalizer 250 includes components capable of adjusting a pulse width of a signal, and may include, for example, a pulse generator and a pulse width modulator. A detailed configuration and operation of the equalizer 250 will be described later.

According to example embodiments, the equalizer 250 receives each of the high-order bit and the low-order bit of the data received from the serializer 220 in the current unit section, and the data received from the serializer 220 during at least one previous unit section may be compared with each of the high-order bit and low-order bit. For example, the equalizer 250 may compare the low-order bits of the data received from the serializer 220 with the two low-order bits received in the previous two or more unit sections.

As each of the upper bit and the lower bit maintains the same bit value for a longer time, the pulse widths of the first control signal and the second control signal output from the equalizer 250 may be greatly adjusted. As an example, the longer the low-order bit holds the bit value [1], the equalizer 250 causes the second control signal to be high in response when the low-order bit transitions from the bit value [1] to the bit value [0]. The transition time from the high logic level to the low logic level may be advanced. Similarly, if the high-order bit holds the bit value [0] for an extended period of time, equalizer 250 responds when the high-order bit transitions from the bit value [0] to the bit value [1] so that the first control signal is a low logic The transition time from the low logic level to the high logic level may be advanced. As described above, by varying the pulse widths of the first control signal and the second control signal according to the time during which each of the high-order bit and the low-order bit of the data maintains the same bit value, the data signal DQ output from the driver 210 is Inter symbol interference may be effectively suppressed.

As illustrated in FIG. 12, in an example embodiment, the equalizer 250 may be connected in series with the driver 210. In this regard, the high-order bit and low-order bit of the data output from the serializer 220 are input to the equalizer 250, and the equalizer 250 generates a first control signal corresponding to the high-order bit and a first control signal corresponding to the low-order bit. Two control signals may be output to the driver 210. As described above, by serially connecting the equalizer 250 and the driver 210 to each other, an increase in capacitance of the output node may be suppressed to improve the characteristics of the data signal DQ.

However, according to an example embodiment, a separate equalizer connected in parallel to the driver 210 may be added between the output terminal of the serializer 220 and the output node to which the data signal DQ is output. In this case, a separate equalizer connected in parallel to the driver 210 may operate in a feed-forward manner rather than in a pulse width modulation method, and may include, for example, a finite impulse response (FIR) filter.

Figure 13:
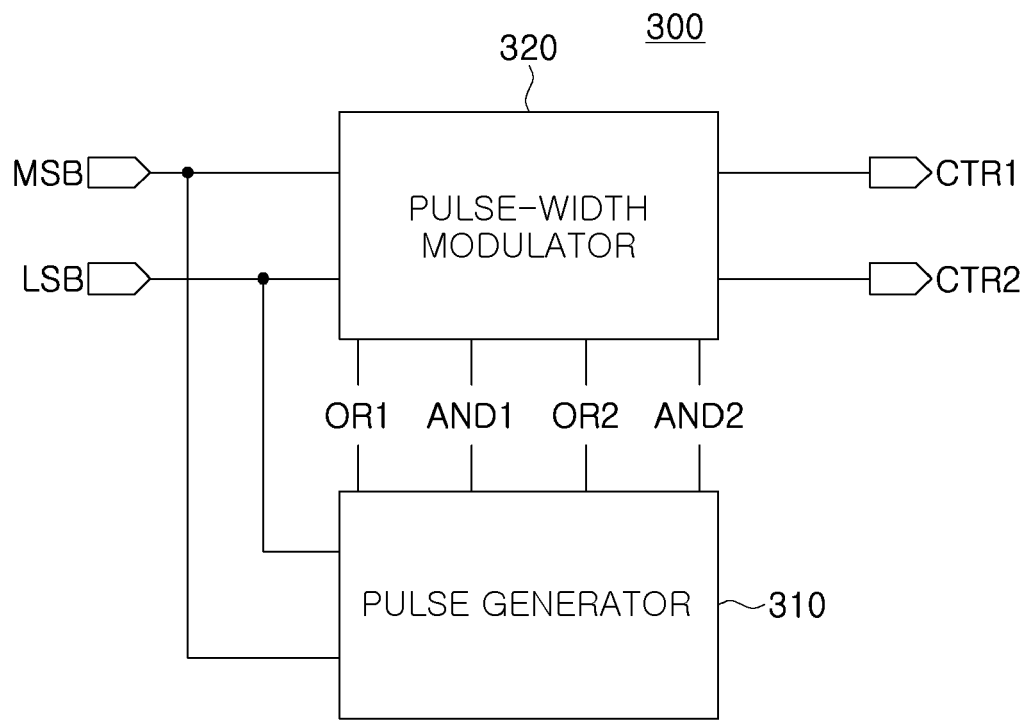
FIG. 13 is a schematic block diagram illustrating an equalizer included in a semiconductor device according to an example embodiment.

FIG. 13 is a schematic block diagram illustrating an equalizer included in a semiconductor device according to an example embodiment.

Referring to FIG. 13, the equalizer 300 included in the semiconductor device according to an example embodiment may include a pulse generator 310 and a pulse width modulator 320. The pulse generator 310 and the pulse width modulator 320 may receive the high-order bit MSB and the low-order bit LSB of data to be transmitted by the semiconductor device, and the semiconductor device may transmit 2-bit data during one unit period. When the semiconductor transmits N-bit data during one unit period, N bits are transmitted with the pulse generator 310 and each may be input to the pulse width modulator 320.

The pulse generator 310 may generate a first OR signal OR1, a first AND signal AND1, a second OR signal OR2 and a second AND signal AND2 using the high-order bit (MSB) and low-order bit (LSB). The pulse width modulator 320 may operate based on the first OR signal OR1, the first AND signal AND1, the second OR signal OR2, the second AND signal AND2, etc., received from the pulse generator 310. The pulse width of the upper bit MSB and the lower bit LSB may be adjusted by the pulse width modulator 320. The pulse width modulator 320 may output the first control signal CTR1 by adjusting the pulse width of the upper bit MSB and the second control signal CTR2 by adjusting the pulse width of the lower bit LSB to the driver.

For example, the driver may have a structure as illustrated in FIG. 5, and the first control signal CTR1 may be input to the first pull-up element PU1 and the third pull-up element PU3, and the second control signal CTR2 may be input to the second pull-up element PU2 and the fourth pull-up element PU4. The complementary signal of the first control signal CTR1 may be input to the first pull-down element PD1, and the complementary signal of the second control signal CTR2 may be input to the second pull-down element PD2.

The first OR signal OR1, the first AND signal AND1, the second OR signal OR2, and the second AND signal AND2 output from the pulse generator 310 includes the high-order bit MSB received from the serializer, and the bit value of each of the low-order bits (LSB) may be generated by calculating each bit value of the high-order bit (MSB) and the low-order bit (LSB) received from the serializer during the previous unit period. Accordingly, depending on whether the bit values of the high-order bit MSB and/or the low-order bit LSB change in each of the previous unit section and the current unit section, the first OR signal OR1, the first AND signal AND1, each value of the second OR signal OR2 and the second AND signal AND2 may be determined.

Figure 14:
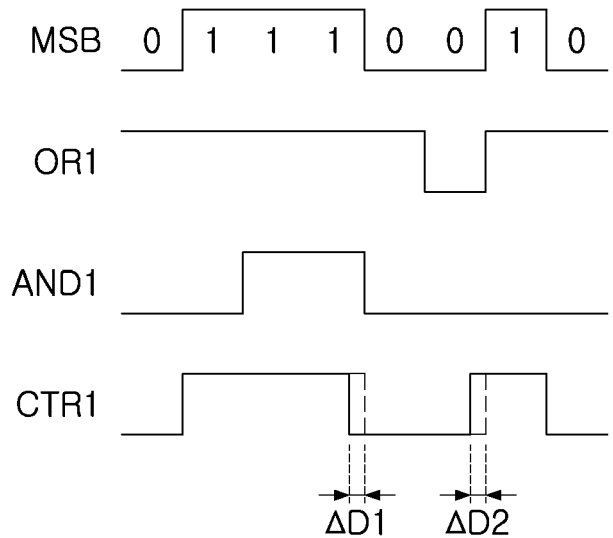
FIG. 14 is a diagram provided to explain an operation of an equalizer included in a semiconductor device according to an example embodiment.

FIG. 14 is a diagram provided to explain an operation of an equalizer included in a semiconductor device according to an example embodiment.

FIG. 14 is a timing diagram provided to explain the first OR signal OR1 and the first AND signal AND1 output from the pulse generator, and the first control signal CTR1 output from the pulse width modulator. As illustrated in FIG. 14, the operation of the equalizer is described with reference to the high-order bit (MSB) included in the data, and the operation of the equalizer according to the low-order bit (LSB) is similar to that described with reference to FIG. 14.

As illustrated in FIG. 14, the pulse generator included in the equalizer calculates the bit value of the high-order bit (MSB) of the data received from the serializer or the like, the bit value of the high-order bit (MSB) received in the previous unit section, and by comparison, the first OR signal OR1 and the first AND signal AND1 may be output. Referring to FIG. 14, the bit values of the high-order bit (MSB) have [0], [1], [1], [1], [0], [0], [1], [0] in order.

The first OR signal OR1 may have a high logic level from the second unit period in which the upper bit MSB has a bit value of [1]. On the other hand, the first AND signal AND1 may have a high logic level from the third unit period in which the upper bit MSB continuously has a bit value of [1].

The first OR signal OR1 and the first AND signal AND1 output from the pulse generator may be input to the pulse width modulator. The pulse width modulator may generate the first control signal CTR1 by adjusting the pulse width of the upper bit MSB with reference to the first OR signal OR1 and the first AND signal AND1.

For example, the pulse width modulator may include at least one pull-up modulation element and at least one pull-down modulation element operating according to the first AND signal AND1 and the first OR signal OR1. Turn-on timing and turn-off timing of the pull-up modulation element and the pull-down modulation element are determined according to the first AND signal AND1 and the first OR signal OR1, and the first control signal CTR1 therefrom the pulse width of may be adjusted.

For example, referring to FIG. 14, when the bit value of the upper bit MSB is continuously maintained at [1] and then changed to [0], the first control signal CTR1 is changed from a high logic level to a low logic level. The timing of transition from [1] to [0] may be advanced by the first time period ΔD1. Also, when the bit value of the upper bit MSB is continuously maintained at [0] and then changed to [1], the timing at which the first control signal CTR1 transitions from the low logic level to the high logic level may be advanced by the second time period ΔD2.

According to an example embodiment, the first time period ΔD1 may be the same as or different from the second time period ΔD2. For example, when the pulse generator compares the bit value of the upper bit MSB only with the bit value of the immediately preceding unit period, the first time period ΔD1 may be the same as the second time period ΔD2. On the other hand, when the pulse generator compares the bit value of the upper bit MSB with the bit value of each of two or more immediately preceding unit sections, the first time period ΔD1 may be longer than the second time period ΔD2.

Figure 15:
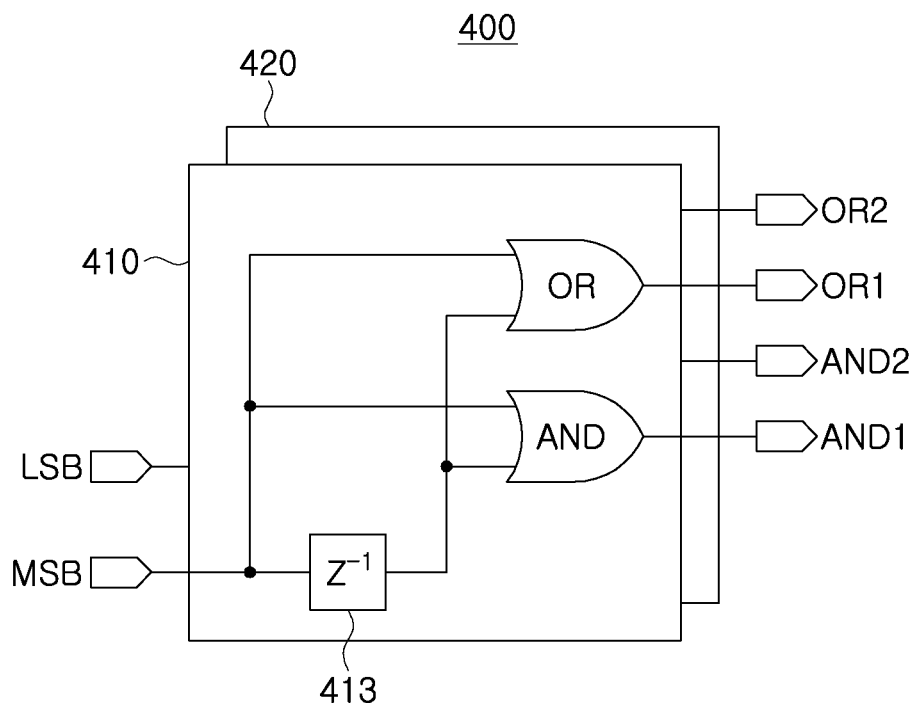
FIGS. 15 to 17 are diagrams provided to explain an operation of an equalizer included in a semiconductor device according to example embodiments.
Figure 16:
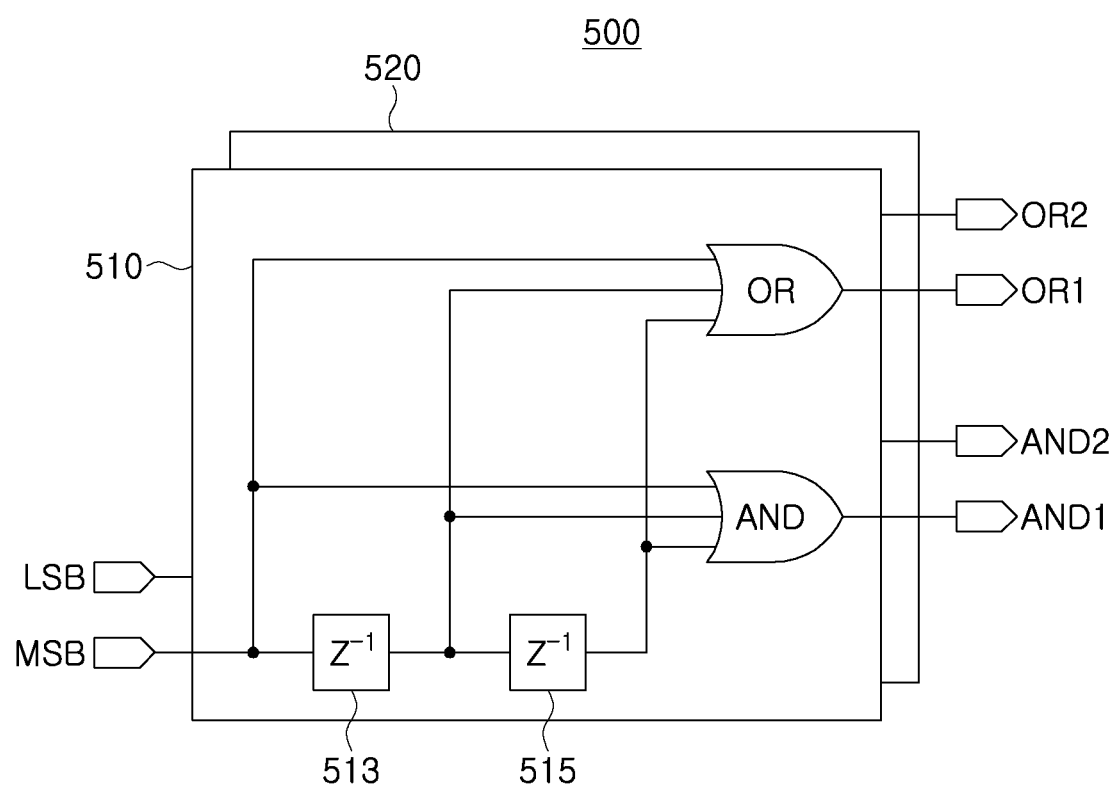
Figure 17:
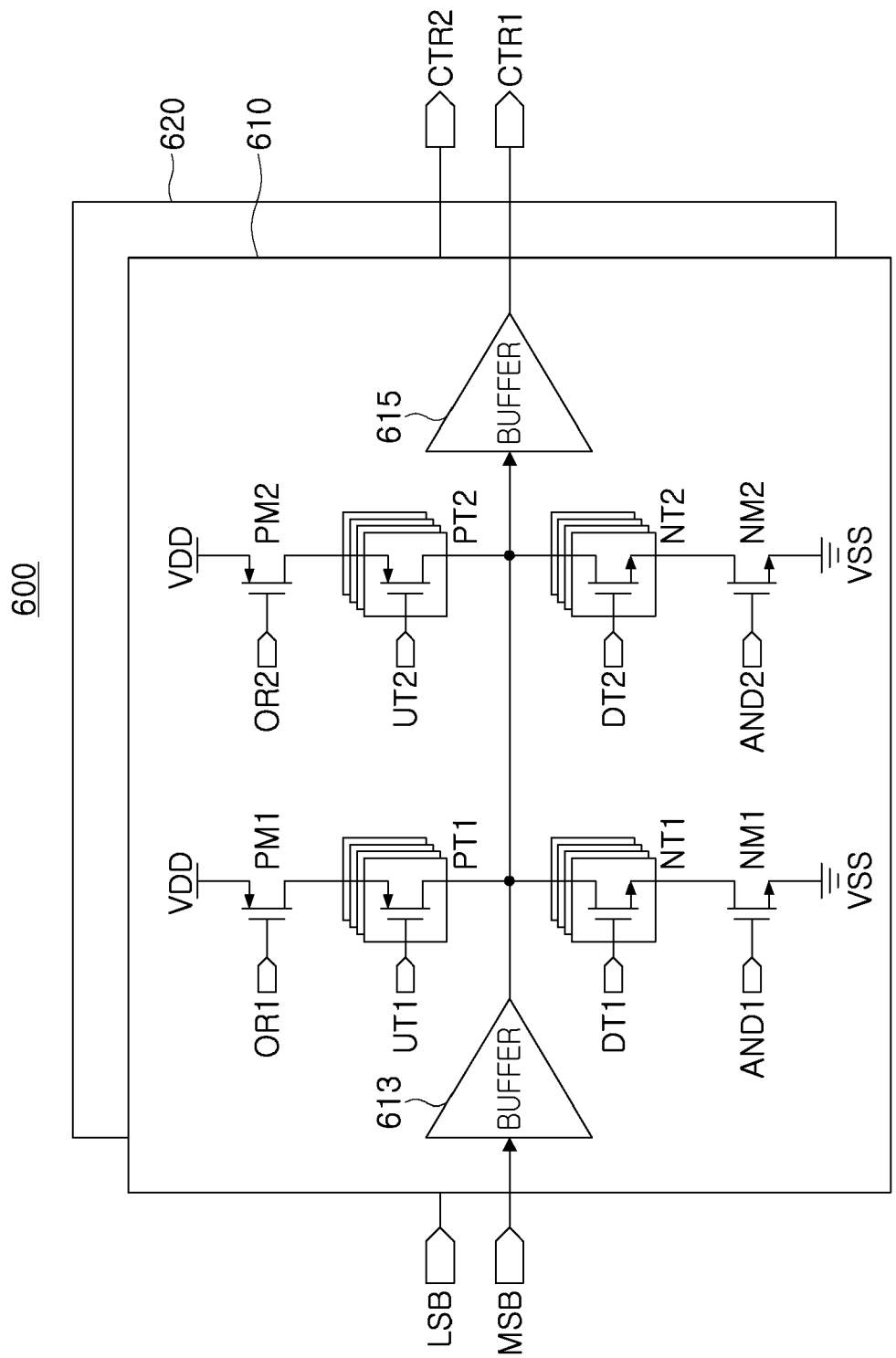

FIGS. 15 to 17 are diagrams provided to explain an operation of an equalizer included in a semiconductor device according to an example embodiment.

FIGS. 15 and 16 are diagrams illustrating pulse generators 400 and 500 included in an equalizer according to example embodiments. First, referring to FIG. 15, the pulse generator 400 receives the upper bit MSB and the lower bit LSB. The pulse generator 400 includes first pulse generator 410 which outputs the first OR signal OR1 and the first AND signal AND1. The pulse generator 400 a second pulse generator 420 that receives the lower bit LSB and outputs the second OR signal OR2 and the second AND signal AND2.

The first pulse generator 410 and the second pulse generator 420 may have similar structures. Hereinafter, the structure of the first pulse generator 410 will be described in detail.

Referring to FIG. 15, the first pulse generator 410 may include an OR gate OR, an AND gate AND, and a delay circuit 413. The delay circuit 413 may store the high-order bit MSB received from the serializer or the like, and then output it to the OR gate and the AND gate AND. Accordingly, the bit value of the current unit section of the high-order bit MSB and the bit value of the unit section immediately before the high-order bit MSB may be input to each of the OR gates OR and the AND gates AND.

The first OR signal OR1 may have a high logic level when the bit value of the upper bit MSB is [1] in at least one of the previous unit section and the current unit section. The first AND signal AND1 may have a high logic level when the bit value of the upper bit MSB is [1] in each of the previous unit section and the current unit section.

The second pulse generator 420 may include an OR gate OR, an AND gate AND, and a delay circuit, and may operate similarly to the first pulse generator 410. For example, the second OR signal OR2 may have a high logic level when the bit value of the lower bit LSB is [1] in at least one of the previous unit section and the current unit section. The second AND signal AND2 may have a high logic level when the bit value of the lower bit LSB is [1] in each of the previous unit section and the current unit section.

FIG. 16 is a diagram illustrating a pulse generator 500 included in an equalizer according to an example embodiment. Referring to FIG. 16, the pulse generator 500 may include a first pulse generator 510 which receives the upper bit MSB and outputs a first OR signal OR1 and a first AND signal AND1, a second pulse generator 520 that receives the lower bit LSB and outputs the second OR signal OR2 and the second AND signal AND2, and the like.

In the pulse generator 500, as illustrated in FIG. 16, the first pulse generator 510 and the second pulse generator 520 each include a first delay circuit 513, a second delay circuit 515, an OR gate (OR) and an AND gate (AND). In the first pulse generator 510, bit values of the first to third unit sections of the upper bit MSB may be input to each of the OR gates OR and the AND gates AND. For example, the first unit section may be a current unit section, the second unit section may be a previous unit section, and the third unit section may be a second previous unit section.

The first OR signal OR1 may have a high logic level when the bit value of the upper bit MSB is [1] in at least one of the two previous unit sections and the current unit section. The first AND signal AND1 may have a high logic level when the bit value of the upper bit MSB is [1] in each of the two previous unit sections and the current unit section.

The second pulse generator 420 may operate similarly to the first pulse generator 410. For example, the second OR signal OR2 may have a high logic level when the bit value of the lower bit LSB is [1] in at least one of the two previous unit sections and the current unit section. The second AND signal AND2 may have a high logic level when the bit value of the lower bit LSB is [1] in each of the two previous unit sections and the current unit section.

FIG. 17 is a diagram illustrating a pulse width modulator 600 included in an equalizer according to an example embodiment. Referring to FIG. 17, the pulse width modulator 600 receives a high-order bit MSB and a low-order bit LSB from a serializer or the like, and a first OR signal OR1 and a first AND signal AND1 from the pulse generator, the second OR signal OR2 and the second AND signal AND2 may be received.

The pulse width modulator 600 may include a first pulse width modulator 610 for outputting a first control signal CTR1 and a second pulse width modulator 620 for outputting a second control signal CTR2. The first pulse width modulator 610 uses the first OR signal OR1, the first AND signal AND1, the second OR signal OR2, and the second AND signal AND2 to generate the pulse width of the upper bit MSB may be changed to output the first control signal CTR1. Similarly, the second pulse width modulator 620 generates a low-order bit LSB by a first OR signal OR1, a first AND signal AND1, a second OR signal OR2, and a second AND signal AND2. The second control signal CTR2 may be output by changing the pulse width.

Referring to the first pulse width modulator 610, a plurality of buffers 613 and 615, a plurality of pull-up modulation elements PM1-PM2, a plurality of pull-down modulation elements NM1-NM2 may include a plurality of pull-up tuning elements PT1-PT2, a plurality of pull-down tuning elements NT1-NT2, and the like. Among the plurality of buffers 613 and 615, the first buffer 613 receives the high-order bit MSB, and at the node where the output terminal of the first buffer 613 and the input terminal of the second buffer 615 are connected, the high-order bit (MSB) of the pulse width may be adjusted. The second buffer 615 may output the first control signal CTR1 in which the pulse width is adjusted in the upper bit MSB.

The plurality of pull-up modulation elements PM1-PM2 may be connected between a third power node supplying the third power supply voltage VDD and an output terminal of the first buffer 613. The plurality of pull-down modulation elements NM1-NM2 may be connected between a fourth power node supplying the fourth power supply voltage VSS and an output terminal of the first buffer 613. The third power supply voltage VDD may have a higher level than the first power supply voltage supplied to the driver. Each of the plurality of pull-up modulation elements PM1-PM2 may be a PMOS transistor, and each of the plurality of pull-down modulation elements NM1-NM2 may be an NMOS transistor.

Among the plurality of pull-up modulation elements PM1-PM2, the first pull-up modulation element PM1 may be turned on and off by the first OR signal OR1, and the second pull-up modulation element PM1 may be turned on and off. The device PM2 may be turned on and off by the second OR signal OR2. Among the plurality of pull-down modulation elements NM1-NM2, the first pull-down modulation element NM1 may be turned on and off by the first AND signal AND1, and the second pull-down modulation element NM2 may be turned on and off by the second AND signal AND2.

In this regard, at least some of the modulation elements included in the first pulse width modulator for outputting the first control signal CTR1 by adjusting the pulse width of the upper bit MSB are determined by the upper bit MSB. Controlled by the generated first OR signal OR1 and the first AND signal AND1, the remaining modulation elements are generated by the second OR signal OR2 and the second AND signal AND2 generated by the low-order bit LSB may be controlled by In an example embodiment, 2-bit data including a high-order bit (MSB) and a low-order bit (LSB) may be transmitted at a time in each of the unit sections of a signal output by the driver. 17, by generating the first control signal CTR1 in consideration of both the high-order bit MSB and the low-order bit LSB, the influence between the high-order bit MSB and the low-order bit LSB may be reflected in the first control signal CTR1.

The first pulse width modulator 610 may further include a plurality of pull-up tuning elements PT1-PT2 and a plurality of pull-down tuning elements NT1-NT2. Each of the first pull-up tuning elements PT1 and the second pull-up tuning elements PT2 may include a plurality of PMOS transistors connected to each other in parallel. Each of the first pull-down tuning elements NT1 and the second pull-down tuning elements NT2 may include a plurality of NMOS transistors connected to each other in parallel.

For example, the first pull-up modulation element PM1 is connected between the first pull-up tuning elements PT1 and the third power node, and the second pull-up modulation element PM2 is connected between the up-tuning elements PT2 and the third power node. Similarly, the first pull-down modulation element NM1 is connected between the first pull-down tuning elements NT1 and the fourth power node, and the second pull-down modulation element NM2 is connected between the down-tuning elements NT2 and the fourth power node.

The degree to which the pulse width of the upper bit MSB is adjusted by the turn-on and turn-off operations of the first pull-up modulation element PM1 may be determined according to the resistance provided by the first pull-up tuning elements PT1. For example, as the resistance provided by the first pull-up tuning elements PT1 is smaller, the higher bit MSB is lowered by the turn-on and turn-off operations of the first pull-up modulation element PM1. The pulse width may vary greatly. The influence of the other modulation elements PM2, NM1, and NM2 on the pulse width of the upper bit MSB may be determined similarly.

Because the first pulse width modulator 610 is configured to adjust the pulse width of the upper bit MSB, the second OR signal OR2 and the second AND signal AND2 generated by the lower bit LSB are more the effects of the first OR signal OR1 and the first AND signal AND1 may need to be reflected more strongly. To this end, the tuning signals UT1, DT1, UT2 and DT2 may be set, such that the number of each of the first pull-up modulation element PT1 and the first pull-down tuning element NT1 turned on by the first tuning signals UT1 and DT1 is greater than the number of each of the second pull-up modulation elements PT2 and the second pull-down tuning elements NT2 turned on by the second tuning signals UT2 and DT2. A value of each of the tuning signals UT1, DT1, UT2, and DT2 may be determined in a manufacturing and testing process of a semiconductor device including the pulse width modulator 600.

Alternatively, the effects of the first OR signal OR1 and the first AND signal AND1 in the first pulse width modulator 610 may be more largely reflected by varying the number of the tuning elements PT1, PT2, NT1, and NT2. For example, in the first pulse width modulator 610, the number of PMOS transistors included in the first pull-up tuning elements PT1 is the number of PMOS transistors included in the second pull-up tuning elements PT2. In addition, the number of NMOS transistors included in the first pull-down tuning elements NT1 may be greater than the number of NMOS transistors included in the second pull-down tuning elements NT2.

The second pulse width modulator 620 may include components similar to those of the first pulse width modulator 610. In the second pulse width modulator 620, the number of tuning elements PT1, PT2, NT1, and NT2 may be set in reverse. For example, in the second pulse width modulator 620, the number of PMOS transistors included in the first pull-up tuning elements PT1 is the number of PMOS transistors included in the second pull-up tuning elements PT2. The number of NMOS transistors included in the first pull-down tuning elements NT1 may be less than the number of NMOS transistors included in the second pull-down tuning elements NT2.

Figure 18:
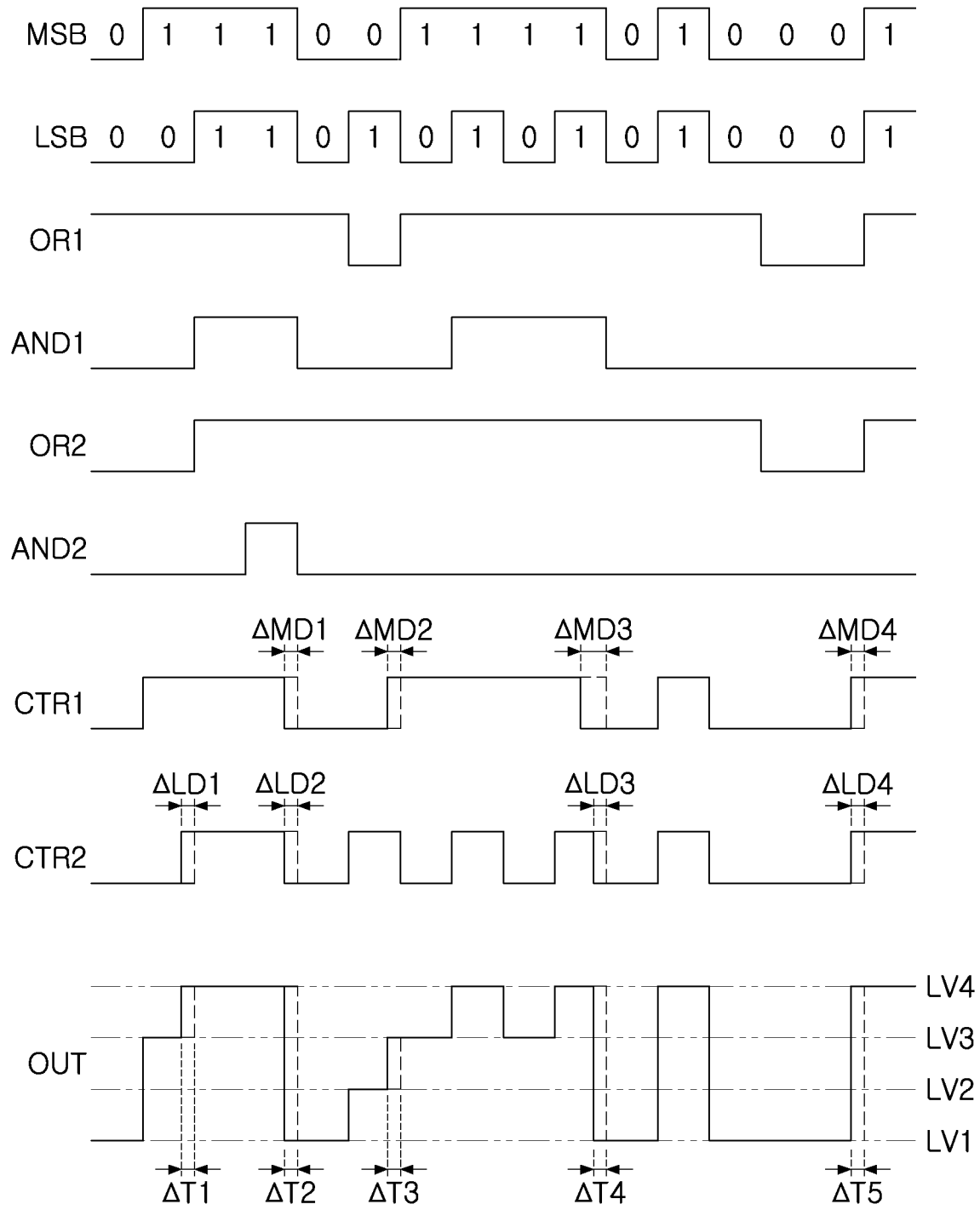
FIG. 18 is a diagram provided to explain an operation of a semiconductor device according to an example embodiment.

FIG. 18 is a diagram provided to explain an operation of a semiconductor device according to an example embodiment.

FIG. 18 is a timing diagram illustrating a first control signal CTR1 and a second control signal CTR2 output from an equalizer that has received a high-order bit MSB and a low-order bit LSB in the semiconductor device according to an example embodiment. The timing diagram of FIG. 18 may correspond to an output signal OUT output by a driver receiving the first control signal CTR1 and the second control signal CTR2.

The equalizer includes a pulse generator and a pulse width modulator, wherein the pulse generator is configured to generate a first OR signal OR1 and a first AND signal AND1 generated based on a high-order bit MSB, and a low-order bit LSB. The generated second OR signal OR2 and the second AND signal AND2 may be output. As described above, each of the first OR signal OR1 and the first AND signal AND1 may be determined according to a bit value of the upper bit MSB in at least one previous unit section and the current unit section. Each of the second OR signal OR2 and the second AND signal AND2 may be determined according to a bit value of the lower bit LSB in at least one previous unit section and the current unit section.

In an example embodiment described with reference to FIG. 18, the pulse generator of the equalizer refers to the bit value of each of the high-order bit (MSB) and the low-order bit (LSB) in each of the previous two unit sections and the current unit section, and may output the first OR signal OR1, the first AND signal AND1, the second OR signal OR2, and the second AND signal AND2. As an example, the configuration and operation of the pulse generator may be understood according to the example embodiment described above with reference to FIG. 16.

Each of the first control signal CTR1 and the second control signal CTR2 may be an output signal of a pulse width modulator included in the equalizer. The equalizer adjusts the pulse width of the upper bit MSB with reference to the first OR signal OR1, the first AND signal AND1, the second OR signal OR2, and the second AND signal AND2 to obtain the control signal CTR1, and the pulse width of the lower bit LSB with reference to the first OR signal OR1, the first AND signal AND1, the second OR signal OR2, and the second AND signal AND2 to obtain the control signal CTR2.

Referring to FIG. 18, when the high-order bit MSB is maintained as a bit value [1] for three unit periods and then transitions to a bit value [0], the high-order bit by the first high-order adjustment time $\Delta MD1$ the pulse width of the MSB may be adjusted to generate the first control signal CTR1. Similarly, when the high-order bit MSB is maintained as a bit value of [0] or [1] in at least two consecutive unit sections, the high-order bit MSB is set for predetermined high-order adjustment times $\Delta MD2$-$\Delta MD4$ to generate the first control signal CTR1.

Among the upper adjustment times $\Delta MD1$-$\Delta MD4$ reflected to adjust the pulse width of the upper bit MSB, the third upper adjustment time $\Delta MD3$ may be relatively longer than other upper adjustment times. This may be because the high-order bit MSB maintains the same bit value in four consecutive unit sections before the third high-order adjustment time $\Delta MD3$ is reflected. On the other hand, when the lower bit LSB maintains the same bit value for two or more unit sections, the pulse width of the lower bit LSB is adjusted for predetermined lower control times $\Delta LD1$-$\Delta LD4$ to control the second control signal CTR2.

The driver may include a plurality of pull-up elements and a plurality of pull-down elements controlled by the first control signal CTR1 and the second control signal CTR2 output from the equalizer. The driver outputs an output signal OUT having a level determined by turn-on and turn-off of each of the plurality of pull-up elements and the plurality of pull-down elements, and the output signal OUT may have one of the first to fourth levels LV1 to LV4.

A time point at which the output signal OUT transitions from one of the first to fourth levels LV1 to LV4 to another level may be different from a time point at which the high-order bit MSB transitions and/or a time point at which the low-order bit LSB transitions. For example, when the low-order bit LSB maintains the bit value [0] for two consecutive unit periods and then transitions to [1], the output signal OUT is more advanced than the time at which the low-order bit LSB transitions. The transition from the third level LV3 to the fourth level LV4 may be earlier by one adjustment time $\Delta T1$. As such, when the high-order bit MSB and/or the low-order bit LSB maintains the same bit value for two consecutive unit sections, the transition timing of the output signal OUT may be changed by the adjustment times $\Delta T1$-$\Delta T5$.

Referring to FIG. 18, by adjusting the pulse widths of the upper bit MSB and the lower bit LSB according to the bit values of the upper bit MSB and the lower bit LSB, the first control signal CTR1 The transition time of the output signal OUT may be changed by generating the second control signal CTR2 and inputting the first control signal CTR1 and the second control signal CTR2 to the driver. In addition, by adaptively adjusting the transition timing of the output signal OUT according to each of the upper bit (MSB) and the lower bit (LSB) of the data to be transmitted, intersymbol interference is reduced to maximize the eye margin. Therefore, signal integrity may be improved.

Figure 19:
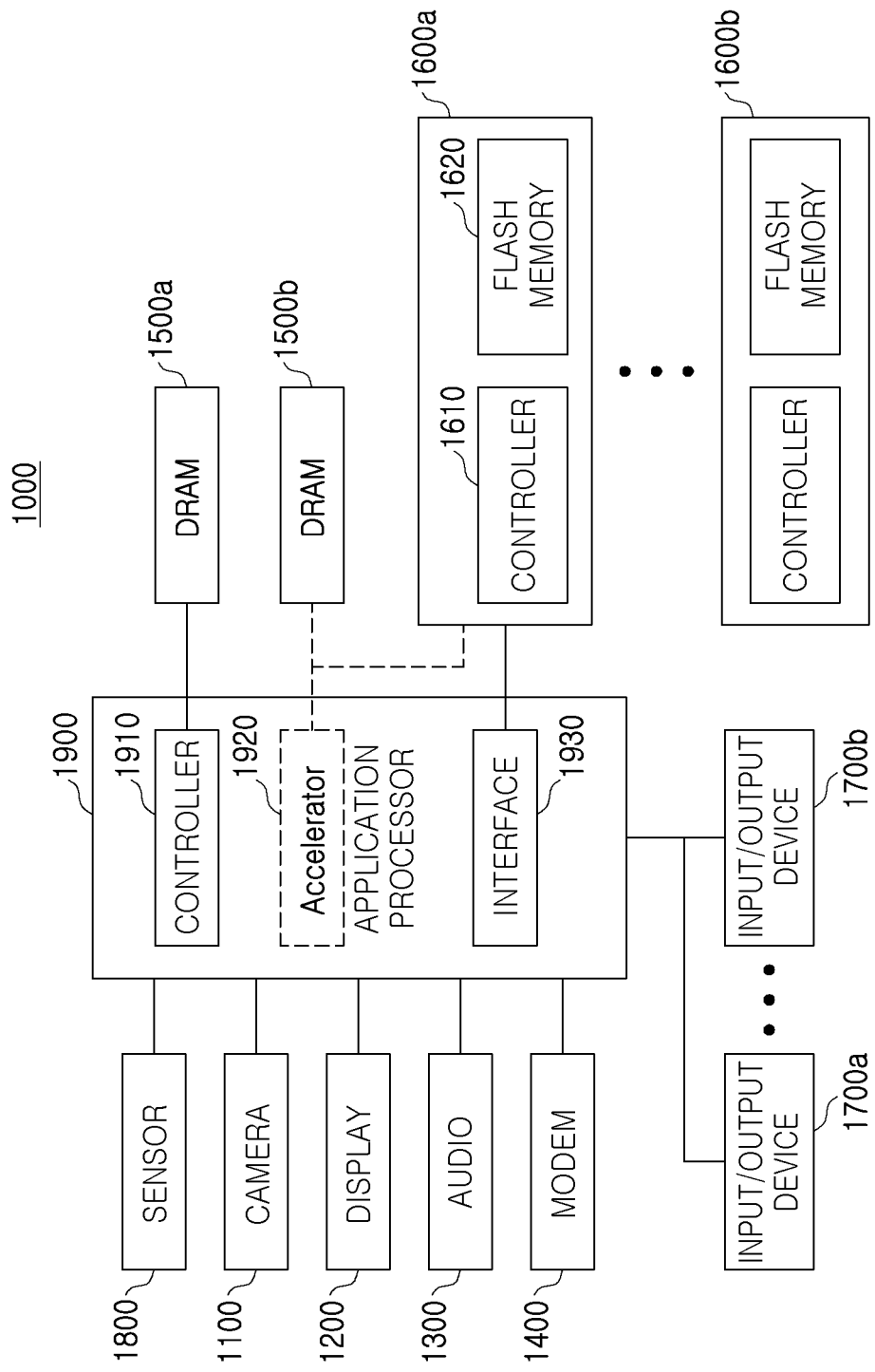
FIG. 19 is a diagram schematically illustrating a system including a memory device according to an example embodiment.

FIG. 19 is a diagram schematically illustrating a system including a memory device according to an example embodiment.

Referring to FIG. 19, the system 1000 includes a camera 1100, a display 1200, an audio processing unit 1300, a modem 1400, DRAMs 1500*a* and 1500*b*, flash memory devices 1600*a* and 1600*b*, input/output devices 1700*a* and

1700*b*, a sensor device 1800, and an application processor (hereinafter, "AP") 1900 may be included.

The system 1000 may be implemented as a laptop computer, a portable terminal, a smart phone, a tablet PC, a wearable device, a healthcare device, or an Internet-of-Things (IoT) device. In addition, the system 1000 may be implemented as a server or a personal computer.

Various components included in the system 1000 may operate in synchronization with a predetermined clock. For example, the display 1200 may display a screen according to a predetermined refresh rate, and the DRAMs 1500*a* and 1500*b* and the flash memory devices 1600*a* and 1600*b* also store and read data at a predetermined speed, or use an external device. In order to communicate with other devices, the modem 1400 may operate according to a predetermined clock. The input/output devices 1700*a* and 1700*b* and the application processor 1900 may also operate according to a predetermined clock.

The camera 1100 may capture a still image or a moving image according to a user's control. The system 1000 may acquire specific information using a still image/video captured by the camera 1100, or convert the still image/video into other types of data such as text and store it. The camera 1100 may include a plurality of cameras having different angles of view or aperture values. In addition, the camera 1100 may further include a camera that generates a depth image by using depth information of the subject and/or the background, in addition to a camera that generates an actual image by photographing the subject.

The display 1200 may also be used as an input device of the system 1000 by providing a touch screen function. Also, the display 1200 may be provided integrally with a fingerprint sensor and the like to provide a security function of the system 1000. The audio processing unit 1300 may process audio data stored in the flash memory devices 1600*a* and 1600*b* or audio data included in content received from the outside through the modem 1400 or the input/output devices 1700*a* and 1700*b*.

The modem 1400 modulates and transmits a signal to transmit/receive wired/wireless data, while demodulating a signal received from the outside to restore an original signal. The input/output devices 1700*a* and 1700*b* are devices that provide digital input/output, and may output vibrations in a haptic manner, such as a port connectable to an external recording medium, an input device such as a touch screen or a mechanical button key, etc. The input/output devices 1700*a* and 1700*b* may include an output device, such as a display or a speaker.

The sensor device 1800 may include a plurality of sensors that collect various information from the outside. In an example embodiment, the sensor device 1800 is configured to obtain biometric information from an illuminance sensor for detecting brightness of light, a gyro sensor for detecting motion of the system 1000, and a user's body in contact with and/or close to the system 1000.

The AP 1900 may control the overall operation of the system 1000. Specifically, the AP 1900 may control the display 1200 to display a portion of the content stored in the flash memory devices 1600*a* and 1600*b* on the screen. Also, when a user input is received through the input/output devices 1700*a* and 1700*b*, the AP 1900 may perform a control operation corresponding to the user input.

In an example embodiment, the AP 1900 may include an accelerator block 1920 that is a dedicated circuit for AI data operation. Alternatively, according to example embodiments, a separate accelerator chip may be provided separately from the AP 1900, and a DRAM 1500*b* may be additionally connected to the accelerator block 1920 or the accelerator chip. The accelerator block 1920 is a function block that professionally performs a specific function of the AP 1900, and includes a graphics processing unit (GPU), AI calculation and inference, which are function blocks that professionally perform graphic data processing. The accelerator block 1920 may include a Neural Processing Unit (NPU), which is a block for professionally performing graphic data processing, and a Data Processing Unit (DPU), which is a block for specialized data processing.

The calibration circuit according to an example embodiment may be variously employed in components connected to each other in the system 1000 to communicate with each other. For example, the camera 1100, the display 1200, the audio processing unit 1300, the modem 1400, the DRAM 1500*a*, 1500*b*, the flash memory devices 1600*a*, 1600*b*, the input/output devices 1700*a*, 1700*b*, the sensor device 1800 may include a driver including a third pull-up element and a fourth pull-up element connected to each other in series in series as described above to the driver connected to the pad for inputting and outputting signals from at least one of the 1800 and the AP 1900. The components may also include an equalizer connected in series with the driver, which may be implemented according to at least one of the example embodiments described above with reference to FIGS. 13 to 18.

For example, the DRAM (1500*a*, 1500*b*) and the flash memory devices (1600*a*, 1600*b*) to the DQ pad that exchanges data signals with the AP 1900 at a high data rate may transmit data of 2 bits or more during one unit period. A driver may be connected. The driver may include a pair of pull-up elements connected to each other in series, between the DQ pad and the power node in order to secure the maximum eye margin, one of the pair of pull-up elements corresponding to the upper bit One control signal may be controlled by a control signal corresponding to the lower bit.

Also, the equalizer may not be directly connected to the DQ pad, but may be connected between an input terminal of the driver and an output terminal of a serializer that serializes and outputs data of two or more bits. The equalizer outputs control signals by adjusting the pulse width of each of the upper bit and the lower bit with reference to the bit value of each of the upper bit and the lower bit, and pull-up elements and pull-down elements included in the driver by the control signals Turn-on and turn-off of the elements may be determined. Accordingly, it is possible to secure an eye margin by reducing inter-symbol interference of a data signal output through the DQ pad, and to improve signal integrity. In addition, power consumption may be reduced by reducing the output capacitance present in the DQ pad.

As set forth above, according to an example embodiment, by additionally connecting at least two or more pull-up elements connected to a driver outputting a multilevel signal, in series, the RLM of the multilevel signal may be improved and the eye margin may be improved. In addition, by connecting an equalizer operating in a manner that adjusts the pulse width of the control signal input to the driver in consideration of the Consecutive Identical Digit (CID) of the data to be transmitted, to the front end of the driver, the effect of the equalizer on the output capacitance of the driver may be reduced.

While aspects of example embodiments have been illustrated and described above, it will be apparent to those skilled in the art that modifications and variations could be made without departing from the scope of the present inventive concept as defined by the appended claims.

What is claimed is:

1. A semiconductor device comprising:
an equalizer circuit configured to output a first control signal corresponding to a first bit of original two-bit data and a second control signal corresponding to a second bit of the original two-bit data; and
a driver circuit comprising a plurality of pull-up transistors connected between an output node and a first power node configured to provide a first power supply voltage, and a plurality of pull-down transistors connected between the output node and a second power node configured to provide a second power supply voltage, wherein the second power supply voltage is lower than the first power supply voltage, and the driver circuit is connected to the equalizer circuit in series,
wherein the plurality of pull-up transistors and the plurality of pull-down transistors are configured to respectively turn on and off according to the first control signal or the second control signal,
wherein the plurality of pull-up transistors comprises a first pull-up transistor and a second pull-up transistor connected to each other in parallel, between the first power node and the output node, and a third pull-up transistor and a fourth pull-up transistor connected to each other in series, between the first power node and the output node, and the first pull-up transistor and the third pull-up transistor are configured to turn on and off according to the first control signal which is provided to the first pull-up transistor and the third pull-up transistor, and
wherein the plurality of pull-down transistors comprises a first pull-down transistor and a second pull-down transistor connected to each other in parallel, between the second power node and the output node.

2. The semiconductor device of claim 1, wherein each of the plurality of pull-up transistors and the plurality of pull-down transistors is an NMOS transistor.

3. The semiconductor device of claim 1, wherein the second pull-up transistor and the fourth pull-up transistor are configured to turn on and off according to the second control signal.

4. The semiconductor device of claim 3, wherein the first pull-down transistor is configured to turn on and off according to a first complementary control signal, and the second pull-down transistor is configured to turn on and off according to a second complementary control signal,
wherein the first complementary control signal and the first control signal are complementary, and
wherein the second complementary control signal and the second control signal are complementary.

5. The semiconductor device of claim 3, wherein the plurality of pull-up transistors further comprises a fifth pull-up transistor and a sixth pull-up transistor connected in series, between the first power node and the output node, and
wherein the third pull-up transistor is connected between the fourth pull-up transistor and the output node, and the fifth pull-up transistor is connected between the first power node and the sixth pull-up transistor.

6. The semiconductor device of claim 5, wherein the fifth pull-up transistor is configured to turn on and off according to the first control signal, and the sixth pull-up transistor is configured to turn on and turned off according to the second control signal.

7. A semiconductor device comprising:
an equalizer circuit configured to output a first control signal corresponding to a first bit of original two-bit data and a second control signal corresponding to a second bit of the original two-bit data; and
a driver circuit comprising a plurality of pull-up transistors connected between an output node and a first power node configured to provide a first power supply voltage, and a plurality of pull-down transistors connected between the output node and a second power node configured to provide a second power supply voltage, wherein the second power supply voltage is lower than the first power supply voltage, and the driver circuit is connected to the equalizer circuit in series,
wherein the plurality of pull-up transistors and the plurality of pull-down transistors are configured to respectively turn on and off according to the first control signal or the second control signal,
wherein the plurality of pull-up transistors comprises a first pull-up transistor and a second pull-up transistor connected to each other in parallel, between the first power node and the output node, and a third pull-up transistor and a fourth pull-up transistor connected to each other in series, between the first power node and the output node,
wherein the plurality of pull-down transistors comprises a first pull-down transistor and a second pull-down transistor connected to each other in parallel, between the second power node and the output node, and
wherein the equalizer circuit comprises:
a pulse generator configured to output a first OR signal and a first AND signal based on the first bit of at least one previous period and the first bit of a current period, and to output a second OR signal and a second AND signal based on the second bit of at least one previous period and the second bit of the current period, and
a pulse width modulator configured to output the first control signal and the second control signal based on the first OR signal, the first AND signal, the second OR signal, and the second AND signal.

8. The semiconductor device of claim 7, wherein the pulse generator comprises a first pulse generator comprising a first OR gate configured to output the first OR signal and a first AND gate configured to output the first AND signal, and a second pulse generator comprising a second OR gate configured to output the second OR signal and a second AND gate configured to output the second AND signal.

9. The semiconductor device of claim 7, wherein the pulse width modulator comprises a buffer circuit having an input terminal configured to receive the first bit and an output terminal configured to output the first control signal, a first pull-up modulation transistor and a second pull-up modulation transistor connected between the output terminal and a third power node configured to supply a third power supply voltage, and a first pull-down modulation transistor and a second pull-down modulation transistor connected between the output terminal and a fourth power node configured to supply a fourth power supply voltage lower than the third power supply voltage.

10. The semiconductor device of claim 9, wherein each of the first pull-up modulation transistor and the second pull-up modulation transistor is a PMOS transistor, and each of the first pull-down modulation transistor and the second pull-down modulation transistor is an NMOS transistor.

11. The semiconductor device of claim 9, wherein the first pull-up modulation transistor is configured to turn on and off according to the first OR signal, the second pull-up modulation transistor is configured to turn on and turned off according to the second OR signal, the first pull-down modulation transistor is configured to turn on and off according to the first AND signal, and the second pull-down modulation transistor is configured to turn on and off according to the second AND signal.

12. The semiconductor device of claim 9, wherein the pulse width modulator further comprises a plurality of first pull-up tuning transistors connected between the first pull-up modulation transistor and the output terminal, and a plurality of second pull-up tuning transistors connected between the second pull-up modulation transistor and the output terminal,
  wherein a number of turned-on transistors among the plurality of first pull-up tuning transistors is greater than a number of turned-on transistors among the plurality of second pull-up tuning transistors.

13. The semiconductor device of claim 9, wherein the pulse width modulator further comprises a plurality of first pull-up tuning transistors connected between the first pull-up modulation transistor and the output terminal, and a plurality of second pull-up tuning transistors connected between the second pull-up modulation transistor and the output terminal,
  wherein a number of the plurality of first pull-up tuning transistors is greater than a number of the plurality of second pull-up tuning transistors.

14. The semiconductor device of claim 9, wherein the pulse width modulator further comprises a plurality of first pull-down tuning transistors connected between the first pull-down modulation transistor and the output terminal, and a plurality of second pull-down tuning transistors connected between the second pull-down modulation transistor and the output terminal,
  wherein a number of the plurality of first pull-down tuning transistors is greater than a number of the plurality of second pull-down tuning transistors.

15. A semiconductor device comprising:
  a first pull-up transistor and a second pull-up transistor connected to each other in parallel, between an output node and a first power node configured to supply a first power supply voltage;
  a first pull-down transistor and a second pull-down transistor connected in parallel, between the output node and a second power node configured to supply a second power supply voltage lower than the first power supply voltage; and
  a pull-up compensation circuit connected between the first power node and the output node,
  wherein the pull-up compensation circuit comprises a third pull-up transistor and a fourth pull-up transistor connected to each other in series, between the first power node and the output node,
  wherein the first pull-up transistor and the third pull-up transistor are configured to simultaneously turn on and off, and
  wherein the second pull-up transistor and the fourth pull-up transistor are configured to simultaneously turn on and turned off.

16. The semiconductor device of claim 15, wherein the pull-up compensation circuit further comprises a fifth pull-up transistor and a sixth pull-up transistor connected to each other in series, between the first power node and the output node, and
  wherein the fifth pull-up transistor is configured to turn on and off simultaneously with the first pull-up transistor and the third pull-up transistor, and the sixth pull-up transistor is configured to turn on and off simultaneously with the second pull-up transistor and the fourth pull-up transistor.

* * * * *